United States Patent
Sugiyama et al.

(10) Patent No.: US 7,329,851 B2
(45) Date of Patent: Feb. 12, 2008

(54) PHOTODETECTOR HAVING A PHOTOSENSITIVE REGION AND TWO-DIMENSIONAL PIXEL ARRANGEMENT

(75) Inventors: Yukinobu Sugiyama, Hamamatsu (JP); Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 63 days.

(21) Appl. No.: 10/542,854

(22) PCT Filed: Jan. 16, 2004

(86) PCT No.: PCT/JP2004/000299

§ 371 (c)(1),
(2), (4) Date: Jan. 9, 2006

(87) PCT Pub. No.: WO2004/065899

PCT Pub. Date: Aug. 5, 2004

(65) Prior Publication Data

US 2006/0163448 A1    Jul. 27, 2006

(30) Foreign Application Priority Data

Jan. 22, 2003 (JP) ............................. 2003-013905

(51) Int. Cl.
*H01L 31/00* (2006.01)
(52) U.S. Cl. ............................. 250/214.1; 250/214 R; 348/302
(58) Field of Classification Search ............. 250/208.1, 250/214 R, 214.1; 348/241, 302, 304, 307–310, 348/290, 278; 257/465, 443; 330/308
See application file for complete search history.

(56) References Cited

U.S. PATENT DOCUMENTS

| 7,193,197 B2 * | 3/2007 | Sugiyama et al. ....... 250/208.1 |
| 2002/0012058 A1 * | 1/2002 | Mizuno ..................... 348/308 |
| 2002/0109072 A1 | 8/2002 | Lowrance et al. |

FOREIGN PATENT DOCUMENTS

| EP | 0 942 583 | 9/1999 |
| JP | 63-266871 | 11/1988 |
| JP | 01-167769 A | 7/1989 |
| JP | 05-029594 A | 2/1993 |
| JP | 06-005832 A | 1/1994 |
| JP | 2001-141562 | 5/2001 |
| WO | 03/055201 A1 | 12/2002 |
| WO | WO 3049190 A1 * | 6/2003 |

* cited by examiner

*Primary Examiner*—Georgia Epps
*Assistant Examiner*—Suezu Ellis
(74) *Attorney, Agent, or Firm*—Drinker Biddle & Reath LLP

(57) ABSTRACT

First integrating circuits 110 convert electric currents from one group of photosensitive portions electrically connected to each other in a plurality of pixels arranged in a first direction into voltages, and output the voltages. First S/H circuits 130 hold and output the voltages outputted from the first integrating circuits 110. A first maximum value detecting circuit 140 detects the maximum value of the voltages outputted from the first S/H circuits 130. First level shift circuits 170 shift levels of the voltages outputted from the first S/H circuits 130. A first A/D converter circuit 180 sets a range from the maximum value detected by the first maximum value detecting circuit 140 to a value smaller than the maximum value by a predetermined value as an A/D conversion range, and converts the voltages outputted from the first S/H circuits 130 into digital values within the A/D conversion range.

5 Claims, 22 Drawing Sheets

RESET SIGNAL

1ST INTEGRATING CIRCUIT OUTPUT

HOLD SIGNAL

1ST S/H CIRCUIT OUTPUT shift(H1)

shift(H2)

shift(HM)

Hout

RESET SIGNAL

2ND INTEGRATING CIRCUIT OUTPUT

HOLD SIGNAL

2ND S/H CIRCUIT OUTPUT shift(V1)

shift(V2)

shift(VN)

Vout

PHOTODETECTOR HAVING A PHOTOSENSITIVE REGION AND TWO-DIMENSIONAL PIXEL ARRANGEMENT

TECHNICAL FIELD

The present invention relates to a photodetector which detects two-dimensional positions where light is incident.

BACKGROUND ART

Generally, in a known photodetector, image data obtained by imaging is taken into an image memory and then two-dimensional positions are detected after image processing, by the use of a solid-state image sensing device such as a MOS image sensor. (see, for example, Patent Document 1).

[Patent Document 1] Japanese Patent Application Laid-Open No. HEI 01-167769

DISCLOSURE OF THE INVENTION

In the above-described known art, however, an image memory is required for storing the obtained image data, which causes a complicated structure of the device. Besides, since two-dimensional positions are detected by an operation process after storing the image data into the image memory, a detecting process of the two-dimensional positions takes time.

The present invention is accomplished in light of the foregoing circumstances, and an object thereof is to provide a photodetector capable of achieving a faster detecting process of two-dimensional positions as well as a simpler structure.

In order to attain the first object described above, in one aspect, the present invention provides a photodetector including a photosensitive region where pixels are arranged two-dimensionally, one pixel being constructed by arranging a plurality of photosensitive portions outputting respective electric currents corresponding to incident light intensities adjacent to each other within a single plane; one set of the photosensitive portions in a plurality of photosensitive portions constituting a plurality of pixels arranged in a first direction in the two-dimensional arrangement being electrically connected to each other; the other set of the photosensitive portions in a plurality of photosensitive portions constituting a plurality of pixels arranged in a second direction in the two-dimensional arrangement being electrically connected to each other; the photodetector comprising: first integrating circuits, provided so as to correspond to one group of photosensitive portions electrically connected to each other in the plurality of pixels arranged in the first direction, for converting corresponding electric currents from the one group of photosensitive portions into voltages and outputting the voltages; a first maximum value detecting circuit for detecting a maximum value of the respective voltages outputted from the first integrating circuits; a first A/D converter circuit for converting the respective voltages outputted from the first integrating circuits into digital values within an A/D conversion range from the maximum value detected by the first maximum value detecting circuit to a value smaller than the maximum value by a predetermined value and outputting the digital values; second integrating circuits, provided so as to correspond to the other group of photosensitive portions electrically connected to each other in the plurality of pixels arranged in the second direction, for converting corresponding electric currents from the other group of photosensitive portions into voltages and outputting the voltages; a second maximum value detecting circuit for detecting a maximum value of the respective voltages outputted from the second integrating circuits; and a second A/D converter circuit for converting the respective voltages outputted from the second integrating circuits into digital values within an A/D conversion range from the maximum value detected by the second maximum value detecting circuit to a value smaller than the maximum value by a predetermined value and outputting the digital values.

In the photodetector in accordance with this aspect of the present invention, light incident on one pixel is detected by a plurality of photosensitive portions constituting the pixel, whereby the photosensitive portions output respective electric currents corresponding to light intensities. Since one set of photosensitive portions are electrically connected to each other in a plurality of pixels arranged in the first direction in the two-dimensional arrangement, the electric current from one photosensitive portion is transmitted to the first direction. Since the other set of photosensitive portions are electrically connected to each other in a plurality of pixels arranged in the second direction in the two-dimensional arrangement, the electric current from the other photosensitive portion is transmitted to the second direction. Thus, the electric current from one photosensitive portion is sent to the first direction, whereas the electric current from the other photosensitive portion is transmitted to the second direction, whereby respective luminous profiles in the first and second directions can be obtained independently from each other. As a result, a quite simple configuration of arranging a plurality of photosensitive portions in one pixel can rapidly detect a two-dimensional position of incident light.

In this aspect of the present invention, the range from the maximum value detected by the first maximum value detecting circuit to a value smaller than the maximum value by a predetermined value is employed as an A/D conversion range, and the respective voltages outputted from the first integrating circuits are converted into digital values within the A/D conversion range, whereby voltages smaller than the value smaller than the maximum value by the predetermined value are converted into "0". Hence, even when background light is incident on the photosensitive portions, the electric current from one photosensitive portion can be A/D-converted in a state where the background light component is eliminated. On the other hand, the range from the maximum value detected by the second maximum value detecting circuit to a value smaller than the maximum value by a predetermined value is employed as an A/D conversion range, and the respective voltages outputted from the second integrating circuits are converted into digital values within the A/D conversion range, whereby voltages smaller than the value smaller than the maximum value by the predetermined value are converted into "0". Hence, the electric current from the other photosensitive portion can be A/D-converted in a state where the background light component is eliminated. As a result of the foregoing, the two-dimensional position of incident light can be detected with a very high accuracy by a small amount of calculation.

Preferably, the photodetector further comprises a first level shift circuit for determining a voltage by subtracting a predetermined value from the maximum value detected by the first maximum value detecting circuit, subtracting thus determined voltage from the respective voltages outputted from the first integrating circuits, and outputting the resulting outputs to the first A/D converter circuit; and a second level shift circuit for determining a voltage by subtracting a predetermined value from the maximum value detected by the second maximum value detecting circuit, subtracting thus determined voltage from the respective voltages outputted from the second integrating circuits, and outputting the resulting outputs to the second A/D converter circuit. Such a configuration allows the above-mentioned A/D conversion ranges to be set easily and reliably.

In another aspect, the present invention provides a photodetector including a photosensitive region where pixels are arranged two-dimensionally, one pixel being constructed by arranging a plurality of photosensitive portions outputting respective electric currents corresponding to incident light intensities adjacent to each other within a single plane; one set of the photosensitive portions in a plurality of photosensitive portions constituting a plurality of pixels arranged in a first direction in the two-dimensional arrangement being electrically connected to each other; the other set of the photosensitive portions in a plurality of photosensitive portions constituting a plurality of pixels arranged in a second direction in the two-dimensional arrangement being electrically connected to each other; the photodetector comprising: first integrating circuits, provided so as to correspond to one group of photosensitive portions electrically connected to each other in the plurality of pixels arranged in the first direction, for converting corresponding electric currents from the one group of photosensitive portions into voltages and outputting the voltages; a first minimum value detecting circuit for detecting a minimum value of the respective voltages outputted from the first integrating circuits; a first A/D converter circuit for converting the respective voltages outputted from the first integrating circuits into digital values within an A/D conversion range from the minimum value detected by the first minimum value detecting circuit to a value greater than the minimum value by a predetermined value and outputting the digital values; second integrating circuits, provided so as to correspond to the other group of photosensitive portions electrically connected to each other in the plurality of pixels arranged in the second direction, for converting corresponding electric currents from the other group of photosensitive portions into voltages and outputting the voltages; a second minimum value detecting circuit for detecting a minimum value of respective voltages outputted from the second integrating circuits; and a second A/D converter circuit for converting the respective voltages outputted from the second integrating circuits into digital values within an A/D conversion range from the minimum value detected by the second minimum value detecting circuit to a value greater than the minimum value by a predetermined value and outputting the digital values.

In the photodetector in accordance with this aspect of the present invention, light incident on one pixel is detected by a plurality of photosensitive portions constituting the pixel, whereby the photosensitive portions output respective electric currents corresponding to light intensities. Since one set of photosensitive portions are electrically connected to each other in a plurality of pixels arranged in the first direction in the two-dimensional arrangement, the electric current from one photosensitive portion is transmitted to the first direction. Since the other set of photosensitive portions are electrically connected to each other in a plurality of pixels arranged in the second direction in the two-dimensional arrangement, the electric current from the other photosensitive portion is transmitted to the second direction. Thus, the electric current from one photosensitive portion is transmitted to the first direction, whereas the electric current from the other photosensitive portion is transmitted to the second direction, whereby respective luminous profiles in the first and second directions can be obtained independently from each other. As a result, a quite simple configuration of arranging a plurality of photosensitive portions in one pixel can rapidly detect a two-dimensional position of incident light.

In this aspect of the present invention, the range from the minimum value detected by the first minimum value detecting circuit to a value greater than the minimum value by a predetermined value is employed as an A/D conversion range, and the respective voltages outputted from the first integrating circuits are converted into digital values within the A/D conversion range, whereby voltages greater than the value greater than the minimum value by the predetermined value are converted into "0". Hence, even when a background light component brighter than a point to be noted is incident on the photosensitive region, the electric current from one photosensitive portion can be A/D-converted in a state where the background light component brighter than the point to be noted is eliminated. On the other hand, the range from the minimum value detected by the second minimum value detecting circuit to a value greater than the minimum value by a predetermined value is employed as an A/D conversion range, and the respective voltages outputted from the second integrating circuits are converted into digital values within the A/D conversion range, whereby voltages greater than the value greater than the minimum value by the predetermined value are converted into "0". Hence, the electric current from the other photosensitive portion can be A/D-converted in a state where the background light component brighter than a point to be noted is eliminated. As a result of the foregoing, the two-dimensional position of incident light can be detected with a very high accuracy by a small amount of calculation.

Preferably, the photodetector is used together with a light source for irradiating an object with light, and arithmetically operates information concerning the light emitted from the light source. Such a configuration can rapidly detect information concerning the light emitted from the light source with a very high accuracy.

Preferably, the information concerning the light is a luminous profile of reflected light of the light emitted from the light source in the first and second directions in the two-dimensional arrangement.

Preferably, the information concerning the light is a luminous profile of direct light of the light emitted from the light source in the first and second directions in the two-dimensional arrangement.

BEST MODES FOR CARRYING OUT THE INVENTION

The photodetector in accordance with an embodiment of the present invention will be explained with reference to the drawings. In the explanation of the drawings, constituents identical to each other or those having functions identical to each other will be referred to with numerals identical to each other without repeating their overlapping explanations. In the following, each of parameters M and N is assumed to be an integer of 2 or greater. Parameter m is assumed to be a given integer of at least 1 but not greater than M whereas parameter n is assumed to be a given integer of at least 1 but not greater than N unless otherwise specified.

Figure 1:
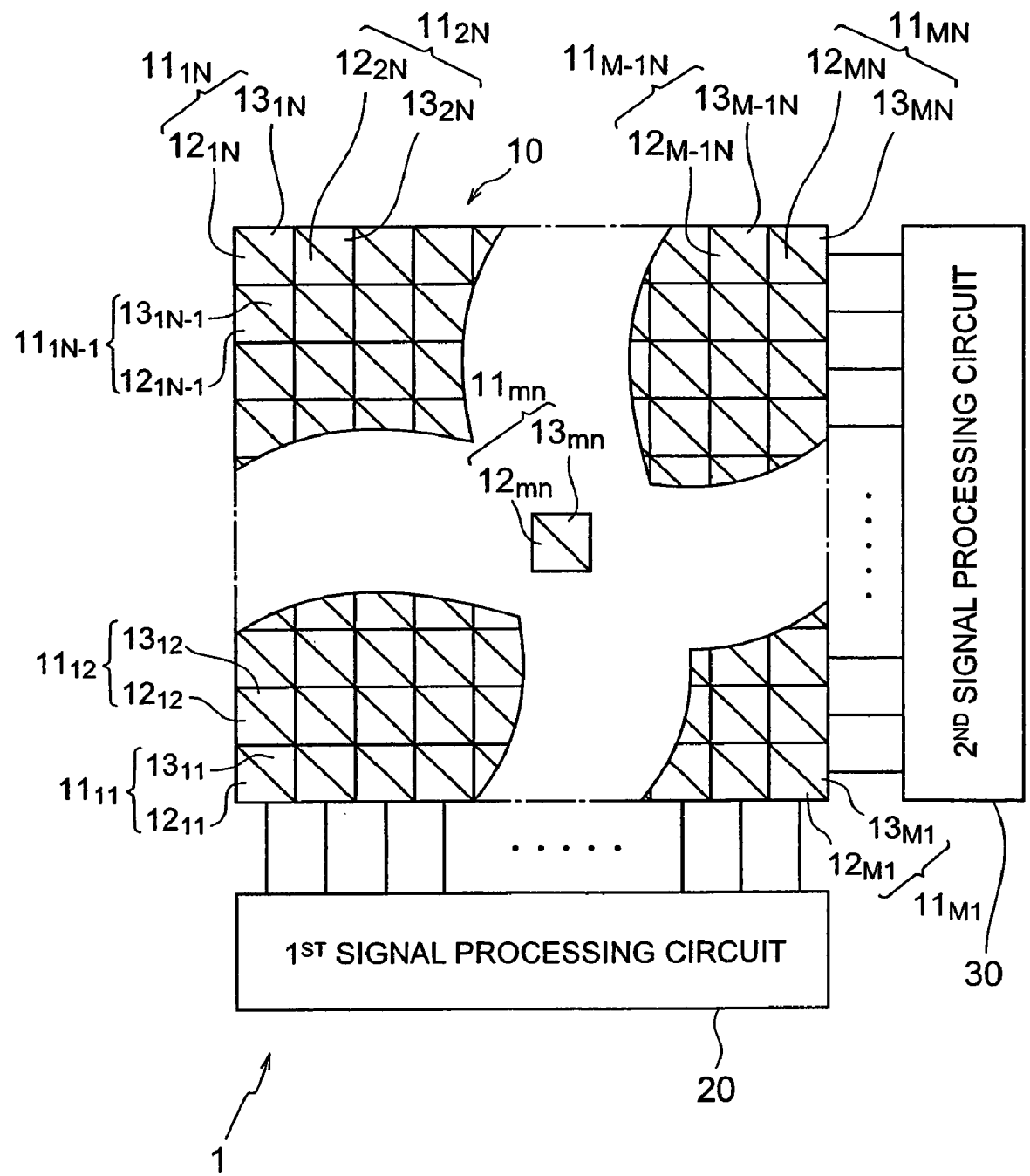
FIG. 1 is a conceptual schematic diagram illustrating the photodetector in accordance with an embodiment.

FIG. 1 is a conceptual schematic diagram illustrating the photodetector in accordance with this embodiment. As shown in FIG. 1, the photodetector 1 in accordance with the embodiment includes a photosensitive region 10, a first signal processing circuit 20, and a second signal processing circuit 30. The photodetector 1 detects an incident position of direct light or reflected light of spot light emitted from a light-emitting device (LED, semiconductor laser, or the like) to an object, for example.

In the photosensitive region 10, pixels $11_{mn}$ are two dimensionally arranged in N rows and M columns. One pixel is constituted by a photosensitive portion $12_{mn}$ (first photosensitive portion) and a photosensitive portion $13_{mn}$ (second photosensitive portion), which output respective currents corresponding to intensities of light incident thereon, are arranged adjacent to each other within a single plane. As a consequence, the photosensitive portions $12_{mn}$ and $13_{mn}$ are arranged within the same plane in a state two-dimensionally mingling with each other.

In a plurality of pixels $11_{11}$ to $11_{1N}$, $11_{21}$ to $11_{2N}$, ..., $11_{M1}$ to $11_{MN}$ arranged in a first direction in the two dimensional arrangement, one set of photosensitive portions $12_{mn}$ (e.g., one set of photosensitive portions $12_{11}$ to $12_{1N}$) in a plurality of photosensitive portions $12_{mn}$, $13_{mn}$ constituting the pixels $11_{mn}$ are electrically connected to each other. In a plurality of pixels $11_{11}$ to $11_{M1}$, $11_{12}$ to $11_{M2}$, ..., $11_{1N}$ to $11_{NM}$ arranged in a second direction in the two dimensional arrangement, the other set of photosensitive portions $13_{mn}$ (e.g., the other set of photosensitive portions $13_{11}$ to $13_{M1}$) in a plurality of photosensitive portions $12_{mn}$, $13_{mn}$ constituting the pixels $11_{mn}$ are electrically connected to each other.

Figure 2:
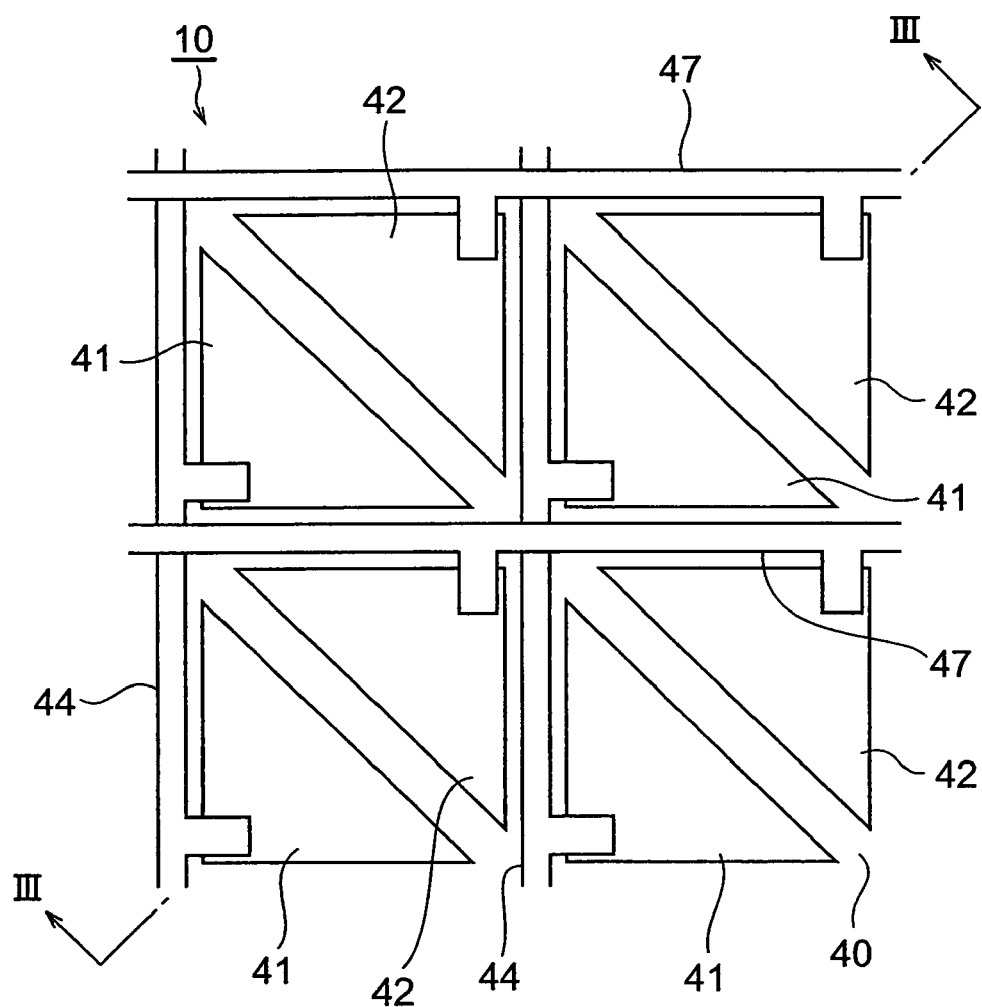
FIG. 2 is an enlarged plan view of a major part illustrating an example of photosensitive region included in the photodetector in accordance with the embodiment.
Figure 3:
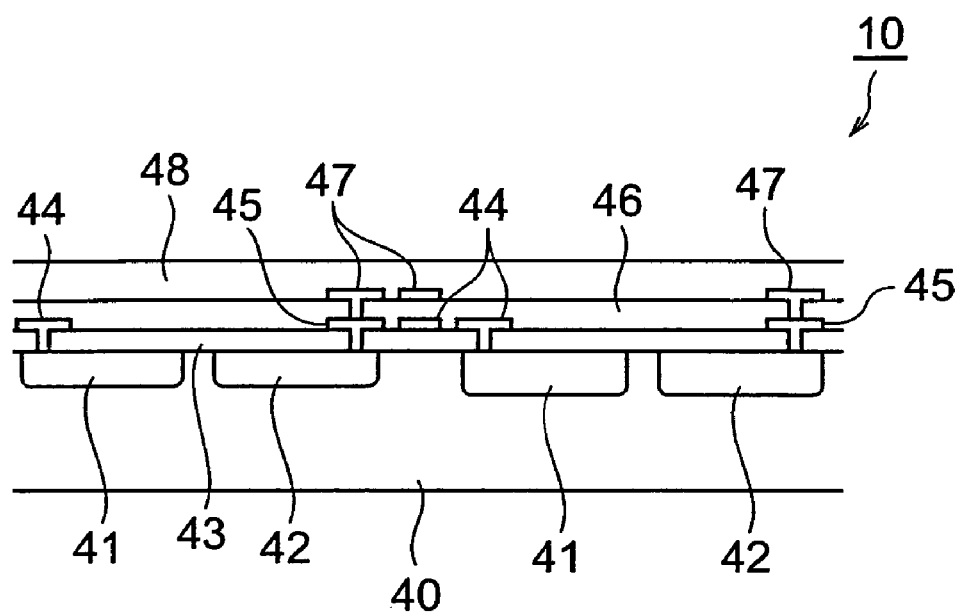
FIG. 3 is a sectional view taken along the line III-III of FIG. 2.

The configuration of the photosensitive region 10 will now be explained with reference to FIGS. 2 and 3. FIG. 2 is an enlarged plan view of a major part illustrating an example of photosensitive regions included in the photodetector, whereas FIG. 3 is a sectional view taken along the line III-III of FIG. 2. FIG. 2 does not show a protective layer 48.

The photosensitive region 10 includes a semiconductor substrate 40 made of a P-type (first conduction type) semiconductor, and N-type (second conduction type) semiconductor regions 41, 42 formed in a surface layer of the semiconductor substrate 40. As a consequence, each of the photosensitive portions $12_{mn}$, $13_{mn}$ includes a semiconductor substrate 40 part and a pair of second conduction type semiconductor regions 41, 42, thereby constructing a photodiode. As shown in FIG. 2, each of the second conduction type semiconductor regions 41, 42 has a substantially triangular form as seen in the light-incident direction, whereas the two regions 41, 42 are formed such that their respective one sides are adjacent to each other in one pixel. The semiconductor substrate 40 is set to the ground potential. The photosensitive region 10 may include a semiconductor substrate made of an N-type semiconductor and a P-type semiconductor region formed in a surface layer of the semiconductor substrate. The regions 41 (photosensitive portions $12_{mn}$) and regions 42 (photosensitive portions $13_{mn}$) are arranged so as to alternate with each other in each of the first and second directions as can be seen in FIG. 2. Also, the regions 41 (photosensitive portions $12_{mn}$) and regions 42 (photosensitive portions $13_{mn}$) are arranged so as to alternate with each other in each of third and fourth directions which intersect with the first and second directions (e.g., at 45°).

A first insulating layer 43 is formed on the semiconductor substrate 40 and regions 41, 42, whereas a first wire 44 is electrically connected to one set of regions 41 by way of contact holes formed in the first insulating layer 43. Electrodes 45 are electrically connected to the other set of regions 42 by way of contact holes formed in the first insulating layer 43.

A second insulating layer 46 is formed on the first insulating layer 43, whereas a second wire 47 is electrically connected to the electrodes 45 by way of contact holes formed in the second insulating layer 46. As a consequence, the other regions 42 are electrically connected to the second wire 47 by way of the electrodes 45.

A protective layer 48 is formed on the second insulating layer 46. The first insulating layer 43, second insulating layer 46, and protective layer 48 are made of $SiO_2$, SiN, or the like. The first wire 44, electrodes 45, and second wire 47 are made of a metal such as Al.

The first wire 44, which electrically connects one set of regions 41 in the pixels $11_{mn}$ to each other in the first direction, is disposed so as to extend in the first direction between the pixels $11_{mn}$. When one set of regions 41 in the pixels $11_{mn}$ are connected to each other with the first wire 44, one set of the photosensitive portions $12_{mn}$ (e.g., one set of photosensitive portions $12_{11}$ to $12_{1N}$) are electrically connected to each other in a plurality of pixels $11_{11}$ to $11_{1N}$, $11_{21}$ to $11_{2N}$, . . . , $11_{M1}$ to $11_{MN}$ arranged in the first direction in the two dimensional arrangement, whereby a photosensitive portion lengthily extending in the first direction in the photosensitive region 10 is constructed. M columns of such photosensitive portions lengthily extending in the first direction are formed.

The second wire 47, which electrically connects the other regions 42 in the pixels $11_{mn}$ to each other in the second direction, is disposed so as to extend in the second direction between the pixels $11_{mn}$. When the other regions 42 in the pixels $11_{mn}$ are connected to each other with the second wire 47, the other set of the photosensitive portions $13_{mn}$ (e.g., the other set of photosensitive portions $13_{11}$ to $13_{M1}$) are electrically connected to each other in a plurality of pixels $11_{11}$ to $11_{M1}$, $11_{12}$ to $11_{M2}$, . . . , $11_{1N}$ to $11_{MN}$ arranged in the second direction in the two dimensional arrangement, whereby a photosensitive portion lengthily extending in the second direction in the photosensitive region 10 is constructed. N rows of such photosensitive portions lengthily extending in the second direction are formed.

In the photosensitive region 10, the M columns of photosensitive portions lengthily extending in the first direction and the N rows of photosensitive portions lengthily extending in the second direction are formed on the same plane.

The regions 41, 42 are not limited to those having substantially triangular forms shown in FIG. 2, but may have other forms as shown in FIGS. 4 to 8.

Figure 4:
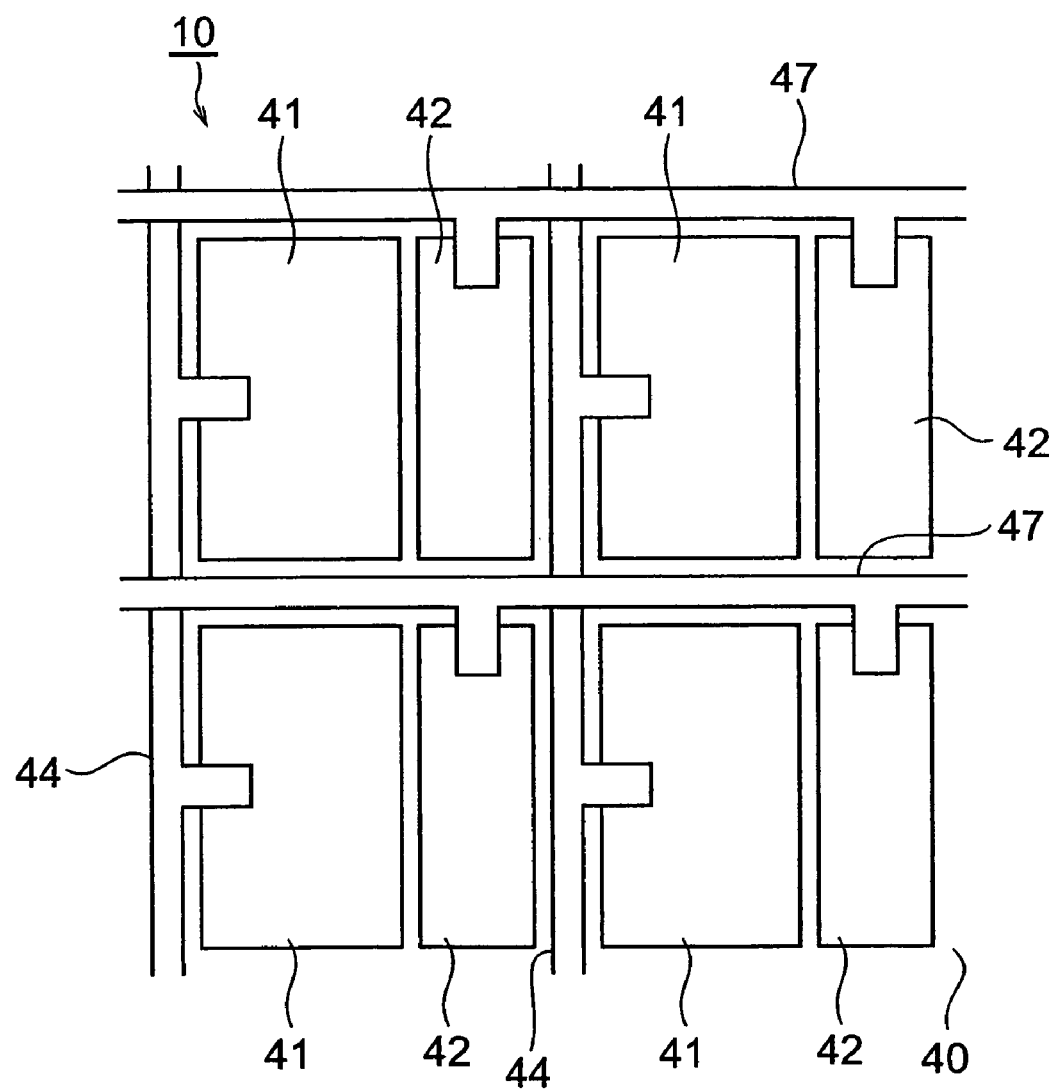
FIG. 4 is an enlarged plan view of a major part illustrating an example of photosensitive region included in the photodetector in accordance with the embodiment.

The second conduction type semiconductor region (photosensitive portion) shown in FIG. 4 has a rectangular form as seen in the light-incident direction, whereas two regions 41, 42 are formed such that their longer sides are adjacent to each other in one pixel. The regions 41 (photosensitive portions $12_{mn}$) and regions 42 (photosensitive portions $13_{mn}$) are arranged so as to alternate with each other in the second direction. As shown in FIG. 4, the area of second conduction type semiconductor regions per pixel may vary between the first and second directions as long as it is constant among pixels in each direction. Namely, it will be sufficient if the total area is constant among photosensitive regions connected to each other by the wires extending in the same direction.

Figure 5:
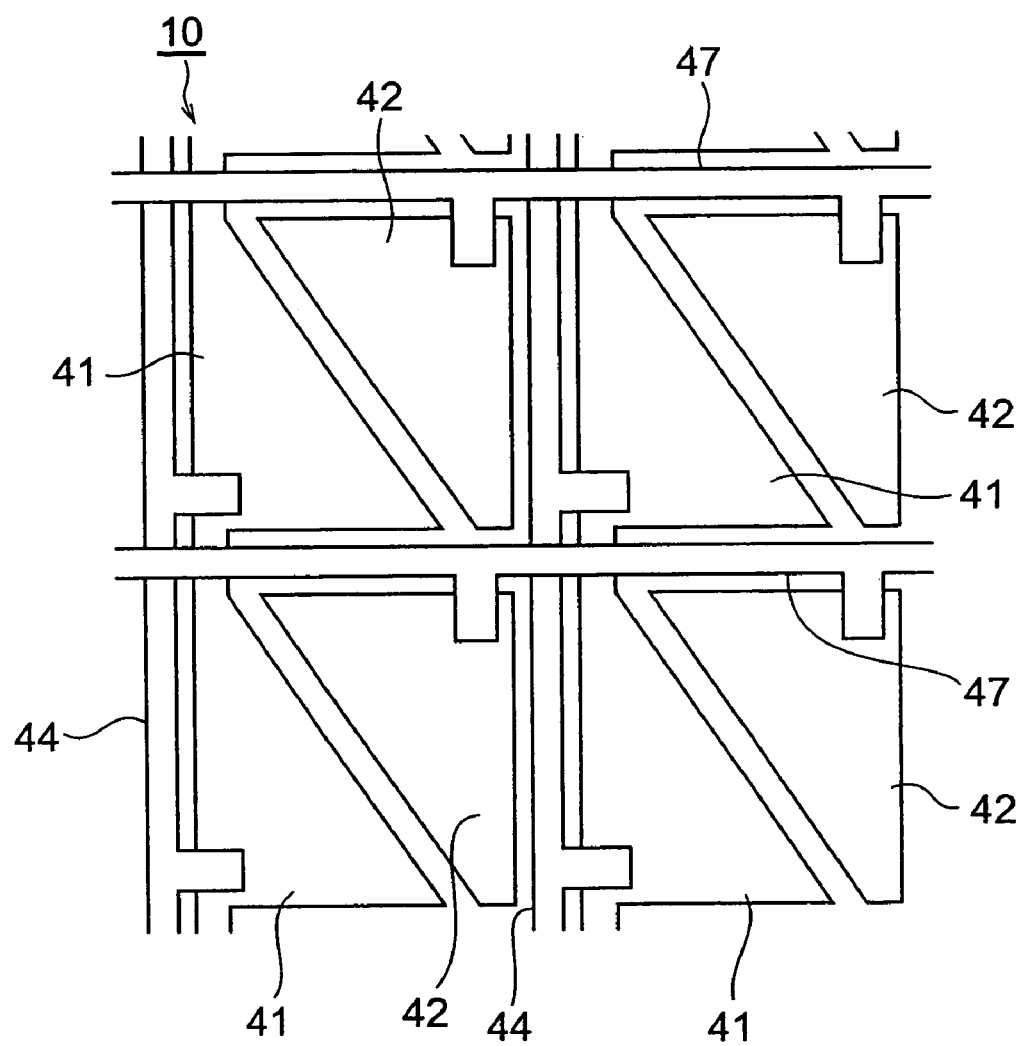
FIG. 5 is an enlarged plan view of a major part illustrating an example of photosensitive region included in the photodetector in accordance with the embodiment.
Figure 6:
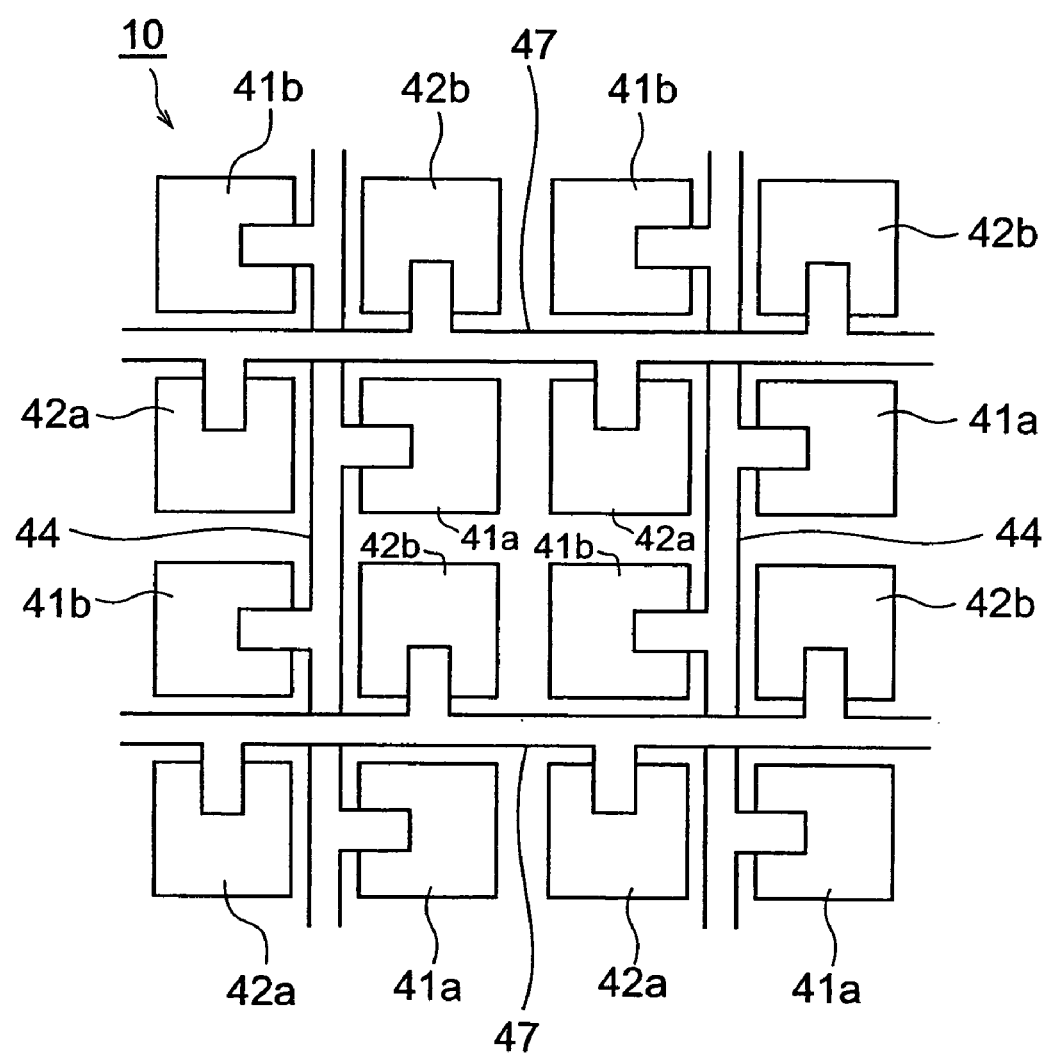
FIG. 6 is an enlarged plan view of a major part illustrating an example of photosensitive region included in the photodetector in accordance with the embodiment.

The second conduction type semiconductor region (photosensitive portion) shown in FIG. 5 is formed such that one set of regions 41 each having a substantially triangular form are formed continuously in the first direction. The other set of regions 42, each having a substantially triangular form, are formed independently from each other among the pixels $11_{mn}$. The regions 41 (photosensitive portions $12_{mn}$) and regions 42 (photosensitive portions $13_{mn}$) are arranged so as to alternate with each other in the second direction. When one set of regions 41 are formed continuously in the first direction, it is not always necessary to provide the first wire 44. However, since the readout speed seems to decrease as the series resistance increases, it will be preferred if the first wire 44 electrically connects the regions 41 to each other.

The second conduction type semiconductor region (photosensitive portion) is constituted by four regions 41a, 41b, 42a, 42b per pixel, whereas those diagonally opposing each other are electrically connected to each other as a pair by a first wire 44 or second wire 47. The regions 41 (photosensitive portions $12_{mn}$) and regions 42 (photosensitive portions $13_{mn}$) are arranged so as to alternate with each other in the first and second directions. Also, the regions 41 (photosensitive portions $12_{mn}$) and regions 42 (photosensitive portions $13_{mn}$) are arranged so as to alternate with each other in third and fourth directions.

Figure 7:
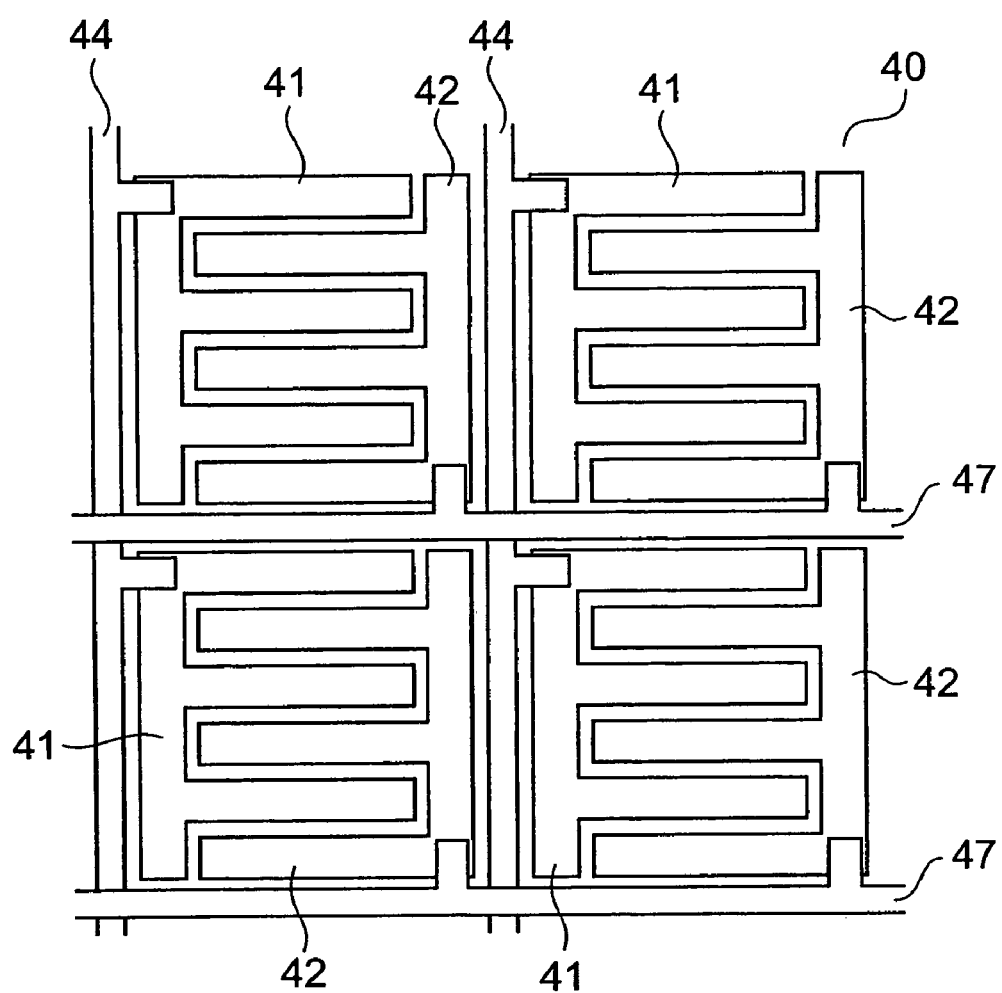
FIG. 7 is an enlarged plan view of a major part illustrating an example of photosensitive region included in the photodetector in accordance with the embodiment.

The second conduction type semiconductor region (photosensitive portion) shown in FIG. 7 is formed such that two pectinate regions 41, 42 are in mesh with each other.

Figure 8:
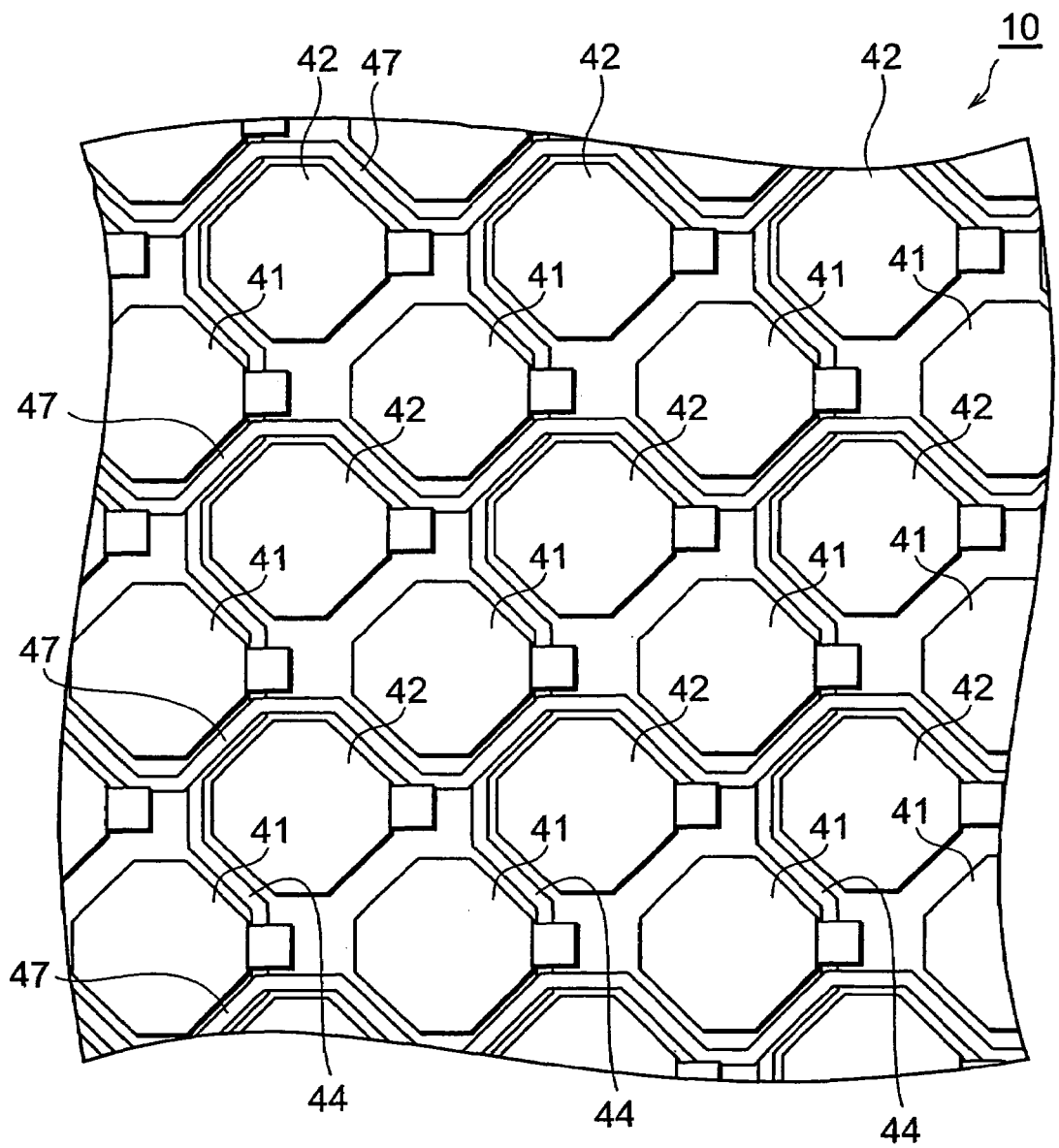
FIG. 8 is an enlarged plan view of a major part illustrating an example of photosensitive region included in the photodetector in accordance with the embodiment.

The second conduction type semiconductor region (photosensitive portion) shown in FIG. 8 is constituted by regions 41, 42 each having a polygonal form (e.g., octagonal form) of quadrangular or higher as seen in the light-incident direction, whereas the regions 41, 42 are formed such that they are adjacent to each other by respective one sides in one pixel. The regions 41 and 42 align in one pixel in a third direction intersecting with the first and second directions, and are arranged like a honeycomb as seen in the light-incident direction. Namely, the regions 41 (photosensitive portions $12_{mn}$) and regions 42 (photosensitive portions $13_{mn}$) are arranged so as to alternate with each other in the third and fourth directions.

Figure 9:
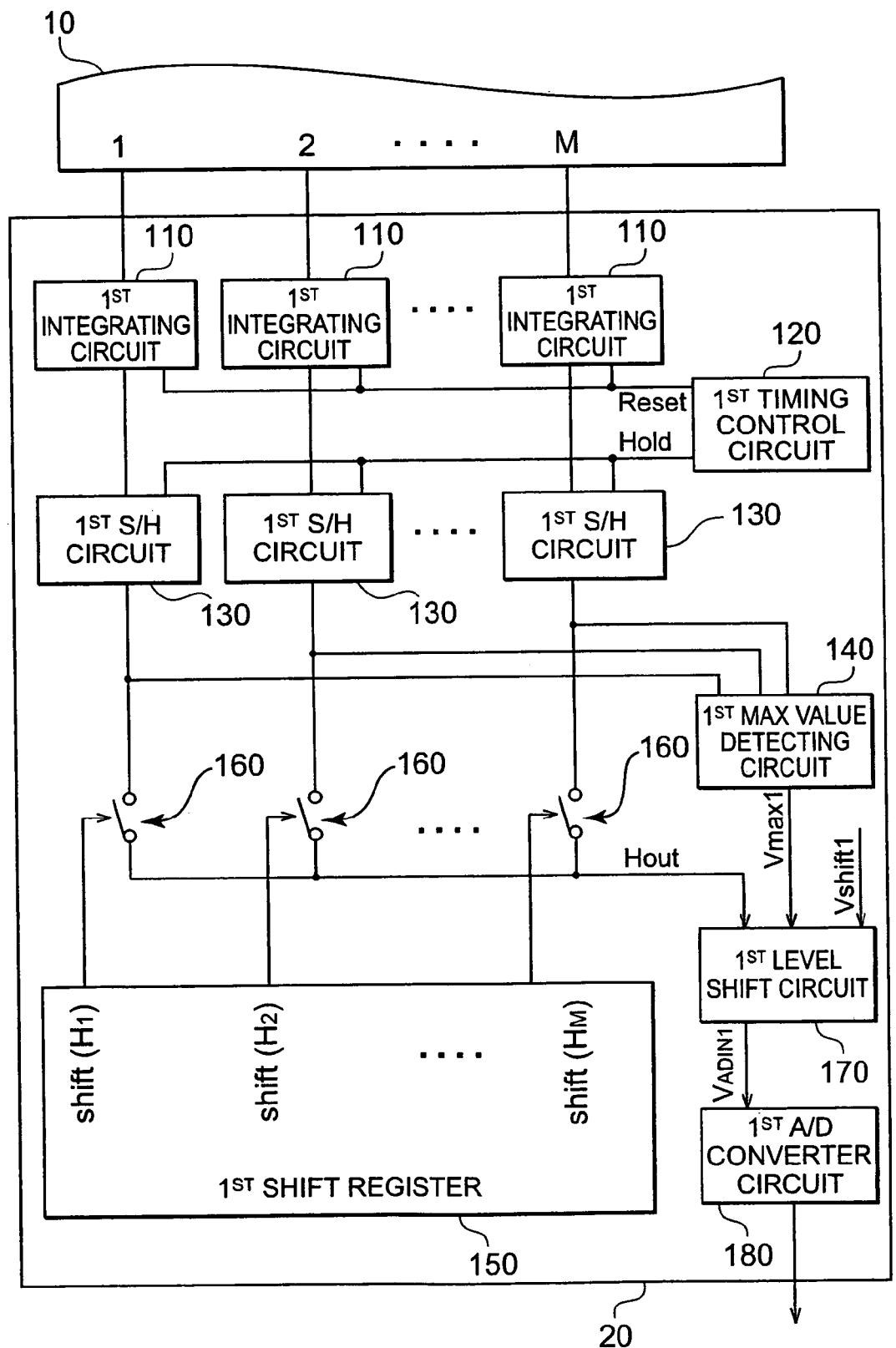
FIG. 9 is a schematic diagram illustrating a first signal processing circuit included in the photodetector in accordance with the embodiment.
Figure 10:
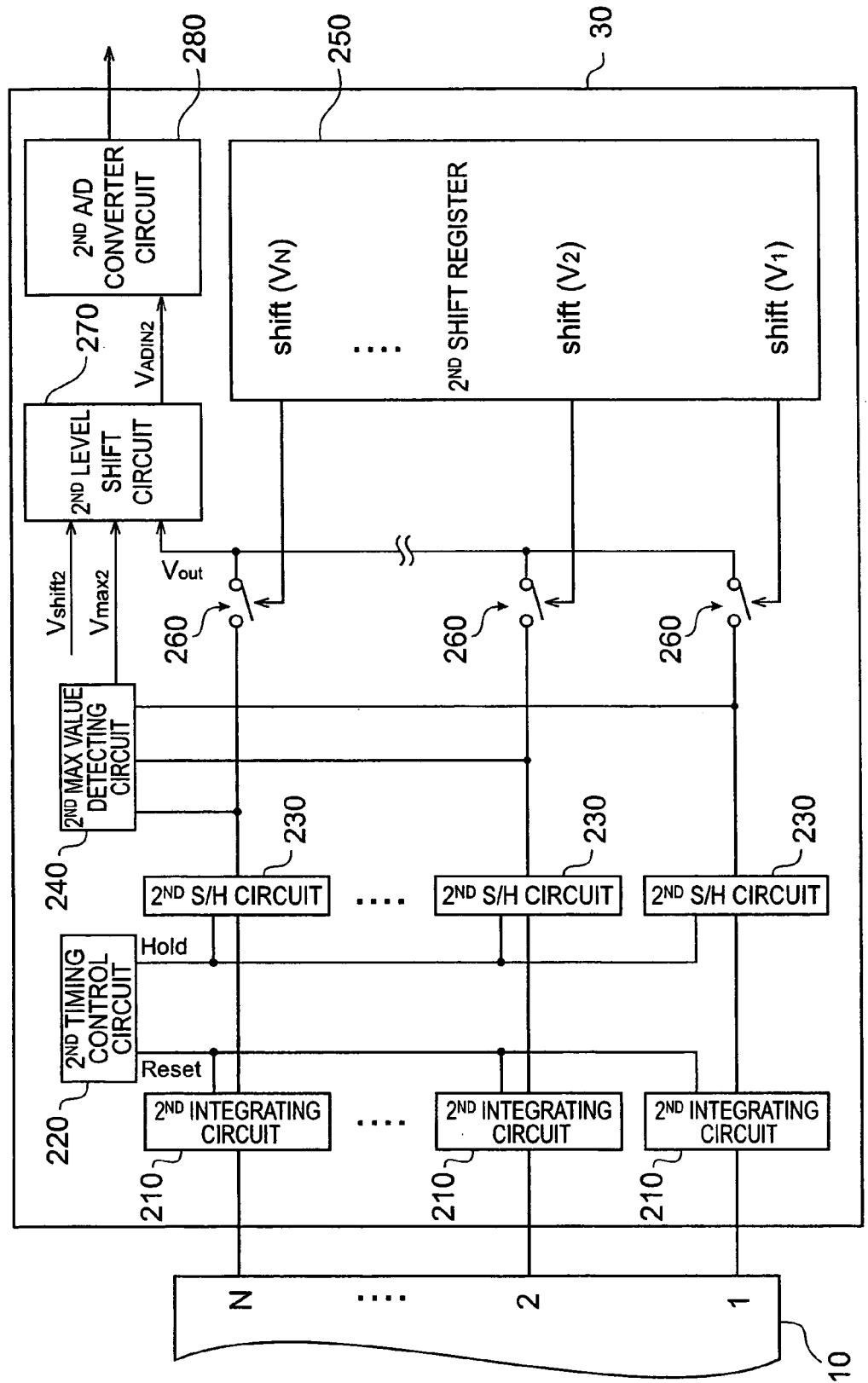
FIG. 10 is a schematic diagram illustrating a second signal processing circuit included in the photodetector in accordance with the embodiment.

With reference to FIGS. 9 and 10, configurations of the first signal processing circuit 20 and second signal processing circuit 30 will now be explained. FIG. 9 is a schematic diagram illustrating the first signal processing circuit, whereas FIG. 10 is a schematic diagram illustrating the second signal processing circuit.

As shown in FIG. 9, the first signal processing circuit 20 comprises first integrating circuits 110, a first timing control circuit 120, first sample-and-hold circuits (hereinafter referred to as first S/H circuits) 130, a first maximum value detecting circuit 140, a first shift register 150, first switches 160, a first level shift circuit 170, and a first A/D converter circuit 180.

Figure 11:
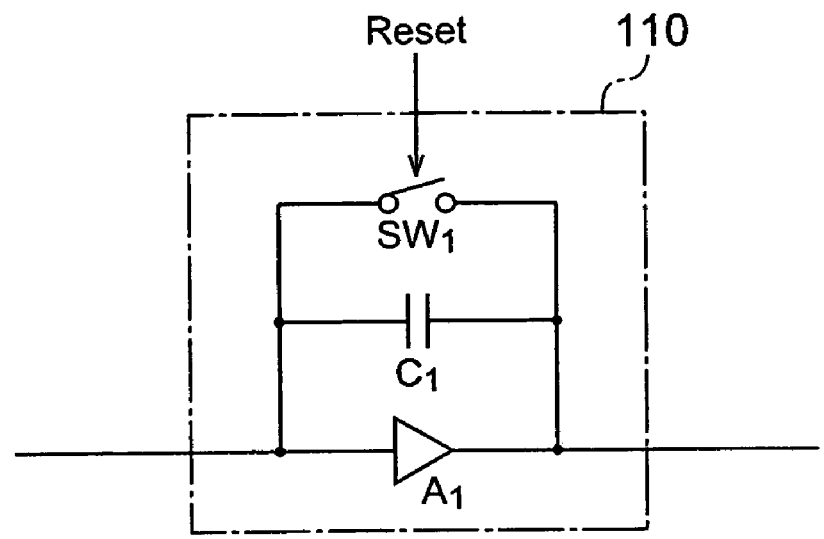
FIG. 11 is a circuit diagram of a first integrating circuit included in the first signal processing circuit.

The first integrating circuits 110 are provided so as to correspond to one group of photosensitive portions $12_{mn}$ (M columns of photosensitive portions, constituted by one set of second conduction type semiconductor regions 41, lengthily extending in the first direction) electrically connected to each other in the plurality of pixels $11_{11}$ to $11_{1N}$, $11_{21}$ to $11_{2N}$, ..., $11_{M1}$ to $11_{MN}$ arranged in the first direction, and convert corresponding electric currents from the one photosensitive portion group $12_{mn}$ into voltages and output the voltages. As shown in FIG. 11, in each first integrating circuit 110, an amplifier $A_1$, a capacitor $C_1$, and a switch $SW_1$ are connected in parallel with each other between input and output terminals. When the switch $SW_1$ is closed, the first integrating circuit 110 discharges an electric charge of the capacitor $C_1$ and initializes it. When the switch $SW_1$ is open, on the other hand, the first integrating circuit 110 accumulates an electric charge fed to the input terminal in the capacitor $C_1$, and outputs a voltage corresponding to an accumulated electric charge from the output terminal. The switch $SW_1$ opens and closes according to Reset signal outputted from the first timing control circuit 120. The first timing control circuit 120 outputs the Reset signal for controlling the opening and closing of the switch $SW_1$, and Hold signal for controlling the opening and closing of a switch $SW_3$ which will be explained later.

Figure 12:
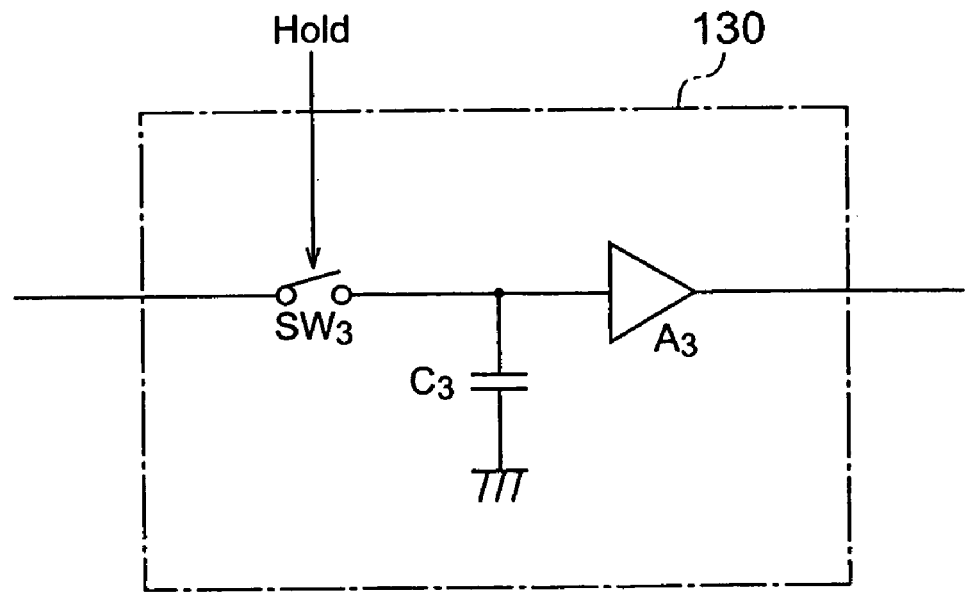
FIG. 12 is a circuit diagram of a first sample-and-hold circuit included in the first signal processing circuit.

The first S/H circuits 130 are provided so as to correspond to the respective first integrating circuits 110, and hold voltages outputted from their corresponding first integrating circuits 110 and then output the voltages. As shown in FIG. 12, each first S/H circuit 130 comprises the switch $SW_3$ and an amplifier $A_3$ in succession between input and output terminals, whereas the junction between the switch $SW_3$ and amplifier $A_3$ is grounded by way of a capacitor $C_3$. The first S/H circuit 130 stores the voltage outputted from its corresponding first integrating circuit 110 when the switch $SW_3$ is closed into the capacitor $C_3$, and holds the voltage of the capacitor $C_3$ even after the switch $SW_3$ is opened, thereby outputting the voltage by way of the amplifier $A_3$. The switch $SW_3$ opens and closes according to the Hold signal outputted from the first timing control circuit 120.

The first switches 160 are sequentially closed under the control of the first shift register 150, and sequentially feed the first level shift circuit 170 with the voltages outputted from the first S/H circuits 130. The first shift register 150, whose operations are controlled by signals (not depicted) outputted from the first timing control circuit 120, outputs signals shift($H_m$) for controlling the opening and closing of first switches 160.

With reference to FIGS. 15A to 15H, operations of the first integrating circuits 110, first timing control circuit 120, first S/H circuits 130, first shift register 150, and first switches 160 will now be explained. FIGS. 15A to 15H are timing charts for explaining operations of the first integrating circuits, first timing control circuit, first S/H circuits, first shift register, and first switches.

When the Reset signal becomes low (see FIG. 15A), the switch $SW_1$ of each first integrating circuit 110 is opened. When the switch $SW_1$ is opened, electric charges outputted from one photosensitive portion $12_{mn}$ group corresponding thereto are accumulated in the capacitor $C_1$, whereby the voltage outputted from the output terminal of the first integrating circuit 110 gradually increases (see FIG. 15B). When the Hold signal becomes High (see FIG. 15C), so that the switch $SW_3$ of each first S/H circuit 130 is closed, the voltage outputted from the output terminal of each first integrating circuit 110 is held in the capacitor $C_3$ of its corresponding first S/H circuit 130 by way of the switch $SW_3$ of the first S/H circuit 130. After the Hold signal becomes Low so that the switch $SW_3$ is opened, the voltage held in the capacitor $C_3$ of each first S/H circuit 130 is outputted from the amplifier $A_3$ (see FIG. 15D). Thereafter, the Reset signal becomes High, so that the switch $SW_1$ of each first integrating circuit 110 is closed, whereby the capacitor $C_1$ is discharged and initialized.

Figure 15A:
FIG. 15A is a graph illustrating the change in Reset signal fed into the first integrating circuit with time.
Figure 15B:
FIG. 15B is a graph illustrating the change in a signal outputted from the first integrating circuit with time.
Figure 15C:
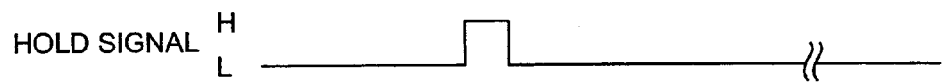
FIG. 15C is a graph illustrating the change in Hold signal fed into the first sample-and-hold circuit with time.
Figure 15D:
FIG. 15D is a graph illustrating the change in a signal outputted from the first sample-and-hold circuit with time.
Figure 15E:
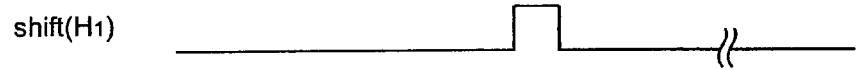
FIG. 15E is a graph illustrating the change in a signal outputted from a first shift register with time.
Figure 15F:
FIG. 15F is a graph illustrating the change in a signal outputted from the first shift register with time.
Figure 15G:
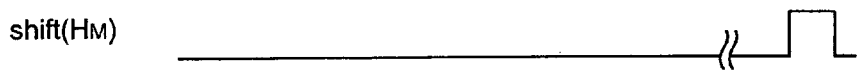
FIG. 15G is a graph illustrating the change in a signal outputted from the first shift register with time.
Figure 15H:
FIG. 15H is a graph illustrating the change in a signal fed into a first level shift circuit with time.

Subsequently, the first shift register 150 sequentially outputs signals shift($H_m$) each having a pulse width corresponding to a predetermined period (see FIGS. 15E to 15G). When the first shift register 150 outputs signals shift($H_m$) to their corresponding first switches 160, the first switches 160 are sequentially closed, whereby the voltages outputted from the amplifiers $A_3$ of their corresponding first S/H circuits 130 are sequentially transmitted to the first level shift circuit 170 (see FIG. 15H).

Figure 16:
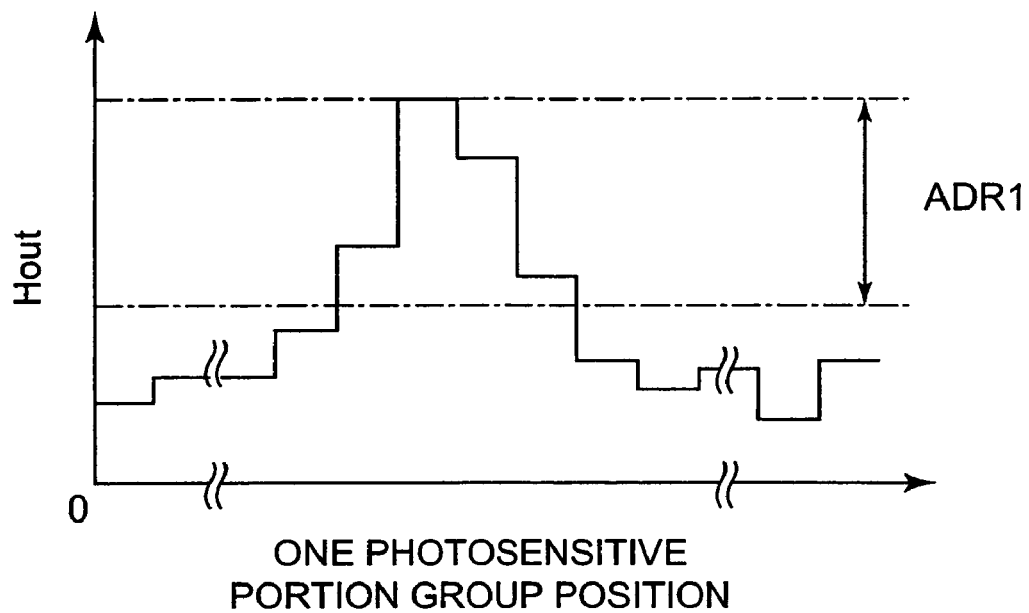
FIG. 16 is a diagram illustrating voltage $H_{out}$ fed into the first level shift circuit with respect to the position of one photosensitive portion group.

Thus, voltages $H_{out}$ corresponding to the electric charges (electric currents) accumulated in one photosensitive portion $12_{mn}$ group electrically connected together in a plurality of pixels $11_{11}$ to $11_{1N}$, $11_{21}$ to $11_{2N}$, ..., $11_{M1}$ to $11_{MN}$ arranged in the first direction are sequentially outputted as time series data per one photosensitive portion $12_{mn}$ group corresponding thereto from the first S/H circuits 130 (first integrating circuits 110) to the first level shift circuit 170 as shown in FIG. 16 as well. This time series data indicates a luminous profile (analog data) in the second direction.

Figure 13:
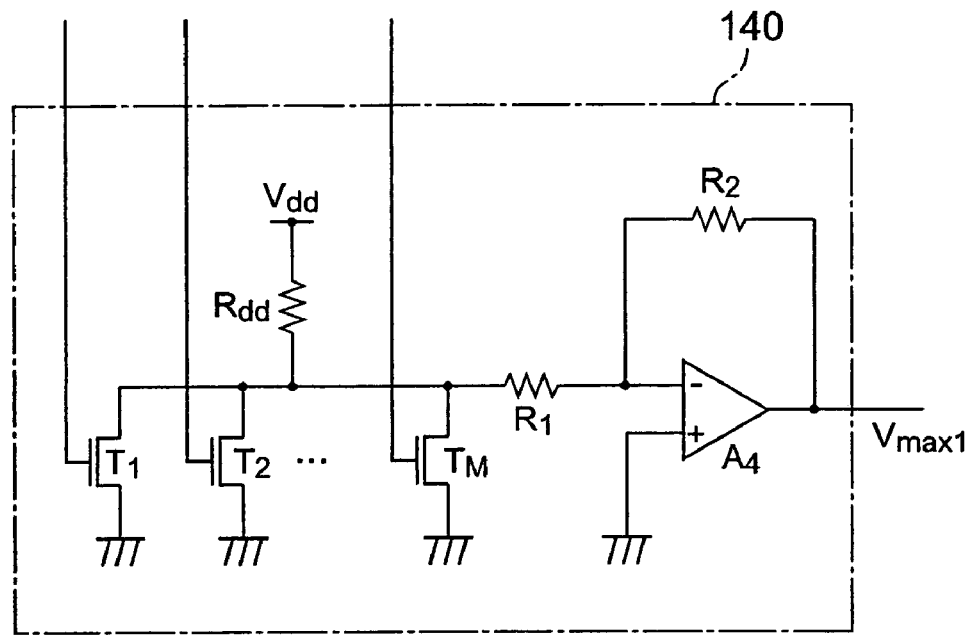
FIG. 13 is a circuit diagram of a first maximum value detecting circuit included in the first signal processing circuit.

Reference will be made to FIG. 9 again. The first maximum value detecting circuit 140 detects the maximum value of respective voltages outputted from the first S/H circuits 130. As shown in FIG. 13, the first maximum value detecting circuit 140 comprises NMOS transistors $T_1$ to $T_M$, resistors $R_1$, $R_2$, and $R_{dd}$, and a differential amplifier $A_4$. The source terminal of each transistor $T_m$ is grounded. The drain terminal of each transistor $T_m$ is connected to power supply voltage $V_{dd}$ by way of a resistor $R_{dd}$, and is connected to the inverting input terminal of the differential amplifier $A_4$ by way of a resistor $R_1$. The gate terminal of each transistor $T_m$ is connected to the output terminal of its corresponding first S/H circuit 130, so as to receive the voltage outputted from the first S/H circuit 130. A resistor R2 is disposed between the inverting input terminal and output terminal of the differential amplifier $A_4$, whereas the non-inverting input terminal of the differential amplifier $A_4$ is grounded. In the first maximum value detecting circuit 140, voltages outputted from the first S/H circuits 130 are fed into the gate terminals of their corresponding transistors $T_m$, and a potential corresponding to the maximum value of the voltages appears at the drain terminals of the transistors $T_m$. The potential of the drain terminals is amplified by the differential amplifier $A_4$ with an amplification factor corresponding to the ratio between respective ohmic values of the resistors $R_1$ and $R_2$, whereby the value of thus amplified voltage is outputted as the maximum voltage $V_{max1}$ from the output terminal to the first level shift circuit 170.

Figure 14:
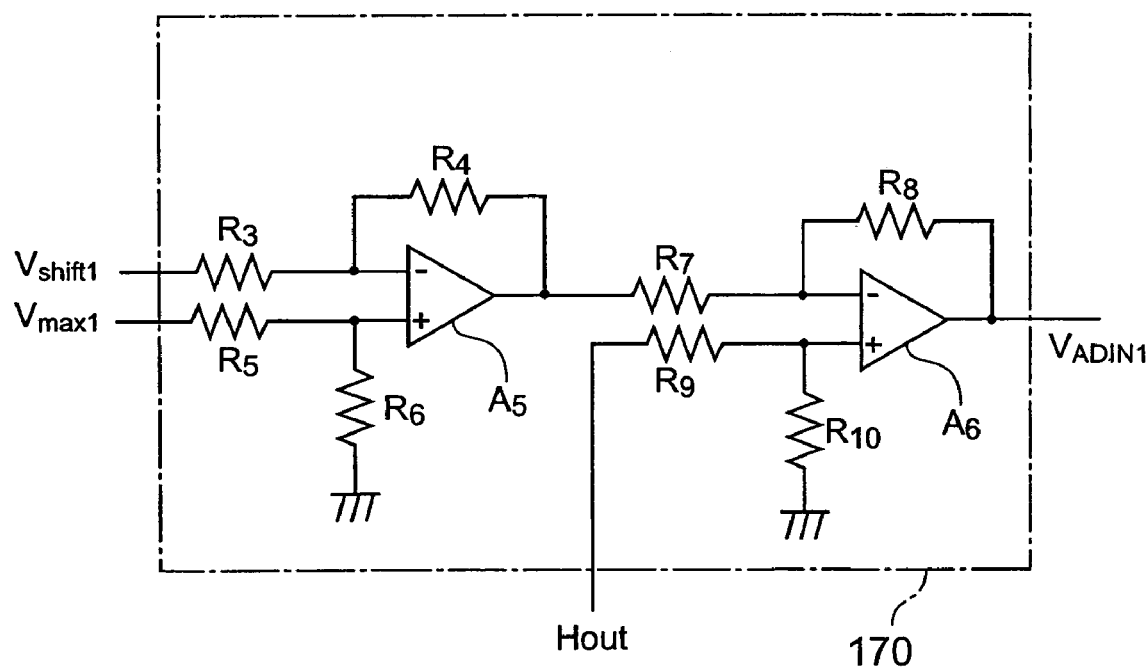
FIG. 14 is a circuit diagram of a first level shift circuit included in the first signal processing circuit.

The first level shift circuit 170 shifts levels of the respective voltages $H_{out}$ sequentially outputted from the first S/H circuits 130. As shown in FIG. 14, the first level shift circuit 170 comprises resistors $R_3$ to $R_{10}$ and differential amplifiers $A_5$, $A_6$. By way of the resistor $R_3$, shift voltage $V_{shift1}$ is fed to the inverting input terminal of the differential amplifier $A_5$. By way of the resistor $R_5$, the output from the first maximum value detecting circuit 140 is connected to the non-inverting input terminal of the differential amplifier $A_5$, whereby the output (maximum voltage $V_{max1}$) from the first maximum value detecting circuit 140 is fed thereto. The resistor $R_4$ is disposed between the inverting input terminal and output terminal of the differential amplifier $A_5$, whereas the non-inverting input terminal of the differential amplifier $A_5$ is grounded by way of the resistor $R_6$. When the resistors $R_3$ to $R_6$ have the same value, the voltage outputted from the differential amplifier $A_5$ becomes a voltage ($V_{max1} - V_{shift1}$) obtained when the shift voltage $V_{shift1}$ is subtracted from the maximum voltage $V_{max}$.

The output terminal of the differential amplifier $A_5$ is connected to the inverting input terminal of the differential amplifier $A_6$ by way of the resistor $R_7$. The respective outputs of the first switches 160 (first S/H circuits 130) are connected to the non-inverting input terminal of the differential amplifier $A_6$ by way of the resistor $R_9$, whereby the above-mentioned voltages $H_{out}$ are fed to this terminal. The resistor $R_8$ is disposed between the inverting input terminal and output terminal of the differential amplifier $A_6$, whereas the non-inverting input terminal of the differential amplifier $A_6$ is grounded by way of the resistor $R_{10}$. The voltages outputted from the differential amplifier $A_6$ become voltages $V_{ADIN1}(=H_{out}-V_{max1}+V_{shift1})$ obtained when the voltage $(V_{max1}-V_{shift1})$ is subtracted from the respective voltages $H_{out}$ sequentially outputted from the first S/H circuits 130 by way of the first switches 160, whereby the voltages $V_{ADIN1}$ are outputted to the first A/D converter circuit 180. As a consequence, the values of respective voltages $H_{out}$ sequentially outputted from the first S/H circuits 130 are shifted by being reduced by a predetermined value corresponding to the voltage $(V_{max1}-V_{shift})$.

As a result of the foregoing, the range from the maximum value $(V_{max1})$ detected by the first maximum value detecting circuit 140 to a value smaller than the maximum value $(V_{max1})$ by a predetermined value $(V_{shift1})$ is set as an A/D conversion range ADR1 as shown in FIG. 16. The value of the above-mentioned shift voltage $V_{shift1}$ is smaller than the maximum value (maximum voltage $V_{max1}$). Since this photodetector 1 is used together with a light source which emits spot light, the light intensity of spot light has been known beforehand, whereby the maximum value detected by the first maximum value detecting circuit 140 can be predicted. Therefore, the value of the above-mentioned shift voltage $V_{shift1}$ can be set beforehand to a value smaller than the maximum value.

Figure 17:
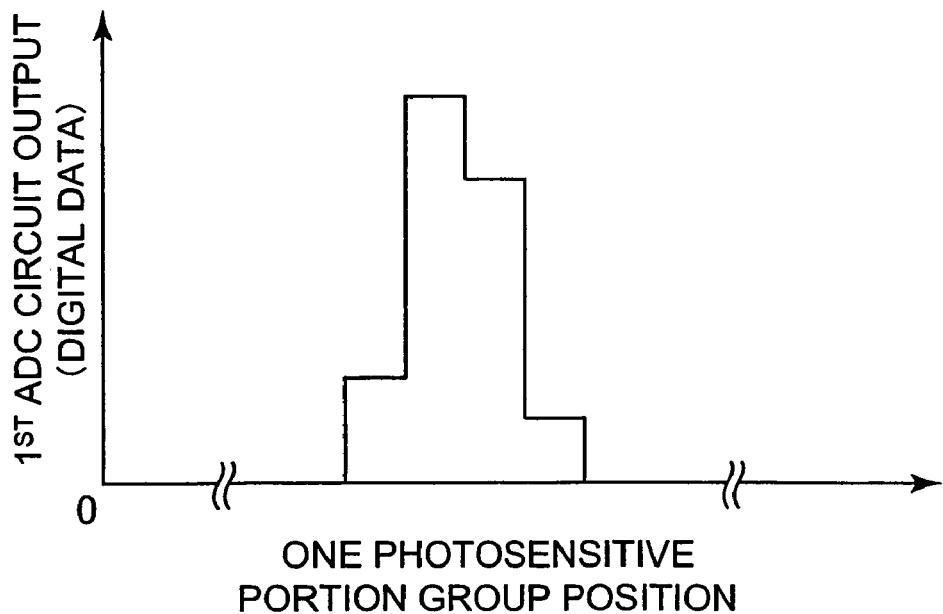
FIG. 17 is a diagram illustrating the output of a first A/D converter circuit with respect to the position of one photosensitive portion group.

The first A/D converter circuit 180 sequentially inputs the voltages $V_{ADIN1}$ (analog values) outputted from the differential amplifier $A_6$ of the first level shift circuit 170, converts the voltages $V_{ADIN1}$ into digital values, and outputs the digital values. As shown in FIG. 17, these digital values become an output indicative of a luminous profile (digital data) in the second direction. The A/D conversion range of the first A/D converter circuit 180 becomes a voltage range from 0 to the shift voltage $V_{shift1}$.

As shown in FIG. 10, the second signal processing circuit 30 comprises second integrating circuits 210, a second timing control circuit 220, second sample-and-hold circuits (hereinafter referred to as second S/H circuits) 230, a second maximum value detecting circuit 240, a second shift register 250, a second level shift circuit 270, and a second A/D converter circuit 280.

The first integrating circuits 210 are provided so as to correspond to the other group of photosensitive portions $13_{mn}$ (N rows of photosensitive portions, constituted by the other second conduction type semiconductor regions 42, lengthily extending in the second direction) electrically connected to each other in the plurality of pixels $11_{11}$ to $11_{M1}$, $11_{12}$ to $11_{M2}$, ..., $11_{1N}$ to $11_{MN}$ arranged in the second direction, and convert corresponding electric currents from the other photosensitive portion group $13_{mn}$ into voltages and output the voltages. Each second integrating circuit 210 has a configuration equivalent to that of the first integrating circuit 110 shown in FIG. 11, such that an amplifier, a capacitor, and a switch are connected in parallel between input and output terminals. The switch of the second integrating circuit 210 opens and closes according to Reset signal outputted from the second timing control circuit 220. The second timing control circuit 220 outputs the Reset signal for controlling the opening and closing of the switch of the second integrating circuit 210, and Hold signal for controlling the opening and closing of switches of second S/H circuits 230 which will be explained later.

The second S/H circuits 230 are provided so as to correspond to the respective second integrating circuits 210, and hold voltages outputted from their corresponding second integrating circuits 210 and then output the voltages. Each second S/H circuit 230 has a configuration equivalent to that of the first S/H circuit 130 shown in FIG. 12, such that a switch and an amplifier are successively provided between input and output terminals, whereas the junction between the switch and amplifier is grounded by way of the capacitor. The switch opens and closes according to the Hold signal outputted from the second timing control circuit 220.

The second switches 260 are sequentially closed under the control of the second shift register 250, and sequentially feed the second level shift circuit 270 with the voltages outputted from the second S/H circuits 230. The second shift register 250, whose operations are controlled by signals (not depicted) outputted from the second timing control circuit 220, outputs signals shift($V_n$) for controlling the opening and closing of second switches 260.

With reference to FIGS. 18A to 18H, operations of the second integrating circuits 210, second timing control circuit 220, second S/H circuits 230, second shift register 250, and second switches 260 will now be explained. FIGS. 18A to 18H are timing charts for explaining operations of the second integrating circuits, second timing control circuit, second S/H circuits, second shift register, and second switches.

When the Reset signal becomes low (see FIG. 18A), the switch of each second integrating circuit 210 is opened. When the switch is opened, electric charges outputted from the other photosensitive portion $13_{mn}$ group corresponding thereto are accumulated in the capacitor, whereby the voltage outputted from the output terminal of the second integrating circuit 210 gradually increases (see FIG. 18B). When the Hold signal becomes High (see FIG. 18C), so that the switch of each second S/H circuit 230 is closed, the voltage outputted from the output terminal of each second integrating circuit 210 is held into the capacitor of its corresponding second S/H circuit 230 by way of the switch of the second S/H circuit 230. After the Hold signal becomes Low so that the switch is opened, the voltage held in the capacitor of each second S/H circuit 230 is outputted from the amplifier (see FIG. 18D). Thereafter, the Reset signal becomes High, so that the switch of each second integrating circuit 210 is closed, whereby the capacitor is discharged and initialized.

Figure 18A:
FIG. 18A is a graph illustrating the change in Reset signal fed into a second integrating circuit with time.
Figure 18B:
FIG. 18B is a graph illustrating the change in a signal outputted from the second integrating circuit with time.
Figure 18C:
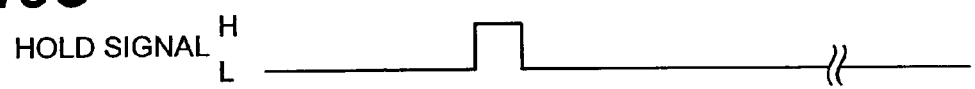
FIG. 18C is a graph illustrating the change in Hold signal fed into a second sample-and-hold circuit with time.
Figure 18D:
FIG. 18D is a graph illustrating the change in a signal outputted from the second sample-and-hold circuit with time.
Figure 18E:
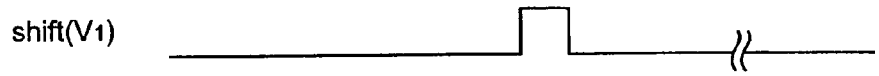
FIG. 18E is a graph illustrating the change in a signal outputted from a second shift register with time.
Figure 18F:
FIG. 18F is a graph illustrating the change in a signal outputted from the second shift register with time.
Figure 18G:
FIG. 18G is a graph illustrating the change in a signal outputted from the second shift register with time.
Figure 18H:
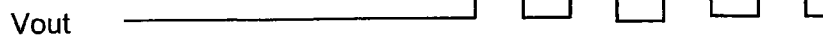
FIG. 18H is a graph illustrating the change in a signal fed into a second level shift circuit with time.

Subsequently, the second shift register 250 sequentially outputs signals shift($V_n$) each having a pulse width corresponding to a predetermined period (see FIGS. 18E to 18G). When the second shift register 250 outputs signals shift($V_n$) to their corresponding second switches 260, the second switches 260 are sequentially closed, whereby the voltages outputted from the amplifiers of their corresponding second S/H circuits 230 are sequentially transmitted to the second level shift circuit 270 (see FIG. 18H).

Figure 19:
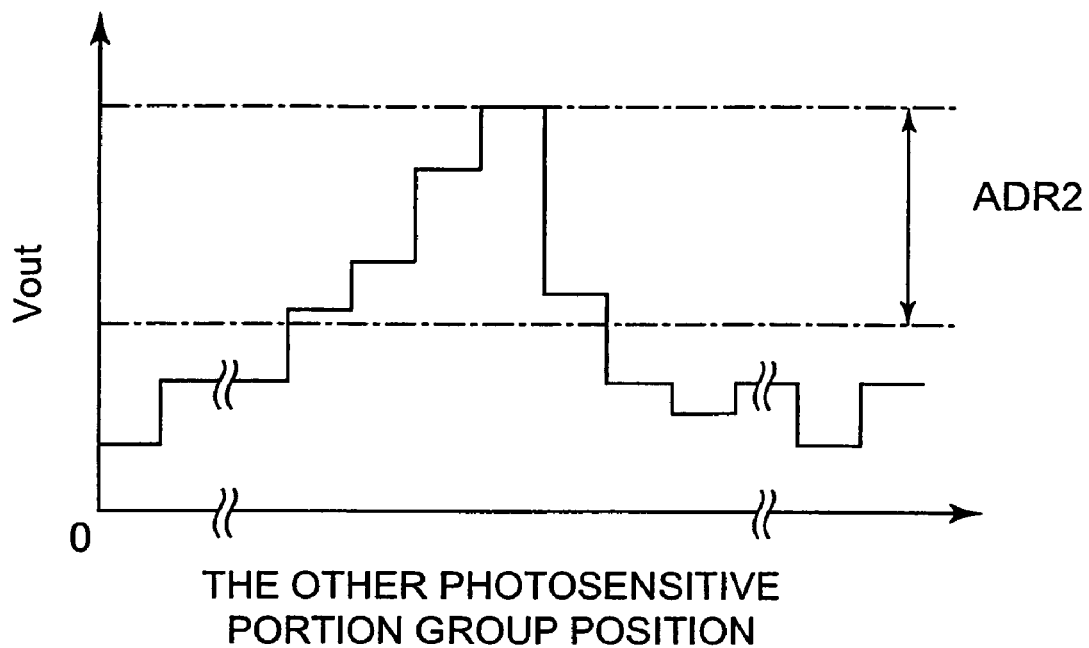
FIG. 19 is a diagram illustrating voltage $V_{out}$ fed into the second level shift circuit with respect to the position of the other photosensitive portion group.

Thus, voltages $V_{out}$ corresponding to the electric charges (electric currents) accumulated in the other photosensitive portion $13_{mn}$, group electrically connected together in a plurality of pixels $11_{11}$ to $11_{M1}$, $11_{12}$ to $11_{M2}$, ..., $11_{1N}$ to $11_{MN}$ arranged in the second direction are sequentially outputted as time series data per the other photosensitive portion $13_{mn}$ group corresponding thereto from the second S/H circuits 230 (second integrating circuits 210) to the second level shift circuit 270 as shown in FIG. 19 as well. This time series data indicates a luminous profile (analog data) in the first direction.

Reference will be made to FIG. 10 again. The second maximum value detecting circuit 240 detects the maximum value of respective voltages outputted from the second S/H circuits 230. The second maximum value detecting circuit 240, which has a configuration equivalent to that of the first maximum value detecting circuit 140 shown in FIG. 13, comprises NMOS transistors, resistors, and a differential amplifier. The source terminal of each transistor is grounded, whereas the drain terminal of each transistor is connected to the power supply voltage by way of a resistor and is connected to the inverting input terminal of the differential amplifier by way of a resistor. The gate terminal of each transistor is connected to the output terminal of its corresponding second S/H circuit 230, so as to receive the voltage outputted from the second S/H circuit 230. A resistor is disposed between the inverting input terminal and output terminal of the differential amplifier, whereas the noninverting input terminal of the differential amplifier is grounded. A maximum voltage $V_{max2}$ corresponding to the maximum value of the respective voltages outputted from the second S/H circuits 230 is outputted from the second maximum value detecting circuit 240 to the second level shift circuit 270.

The second level shift circuit 270 shifts levels of the respective voltages $V_{out}$ sequentially outputted from the second S/H circuits 230. The second level shift circuit 270, which has a configuration equivalent to that of the first level shift circuit 170 shown in FIG. 14, comprises resistors and differential amplifiers. Voltages $V_{ADIN2}$ ($=V_{out}-V_{max2}+V_{shift2}$) obtained when a voltage ($V_{max2}-V_{shift2}$) is subtracted from the respective values of voltage $V_{out}$ sequentially outputted from the second S/H circuits 230 are outputted from the second level shift circuit 270 to the second A/D converter circuit 280. As a consequence, the values of respective voltages $V_{out}$ sequentially outputted from the second S/H circuits 230 are shifted by being reduced by a predetermined value corresponding to the voltage ($V_{max2}-V_{shift2}$).

As a result of the foregoing, the range from the maximum value ($V_{max2}$) detected by the second maximum value detecting circuit 240 to a value smaller than the maximum value ($V_{max2}$) by a predetermined value ($V_{shift2}$) is set as an A/D conversion range ADR2 as shown in FIG. 19. The value of the above-mentioned shift voltage $V_{shift2}$ is smaller than the maximum value (maximum voltage $V_{max2}$). Since this photodetector 1 is used together with a light source which emits spot light, the light intensity of spot light has been known beforehand, whereby the maximum value detected by the second maximum value detecting circuit 240 can be predicted. Therefore, the value of the above-mentioned shift voltage $V_{shift2}$ can be set beforehand to a value smaller than the maximum value.

Figure 20:
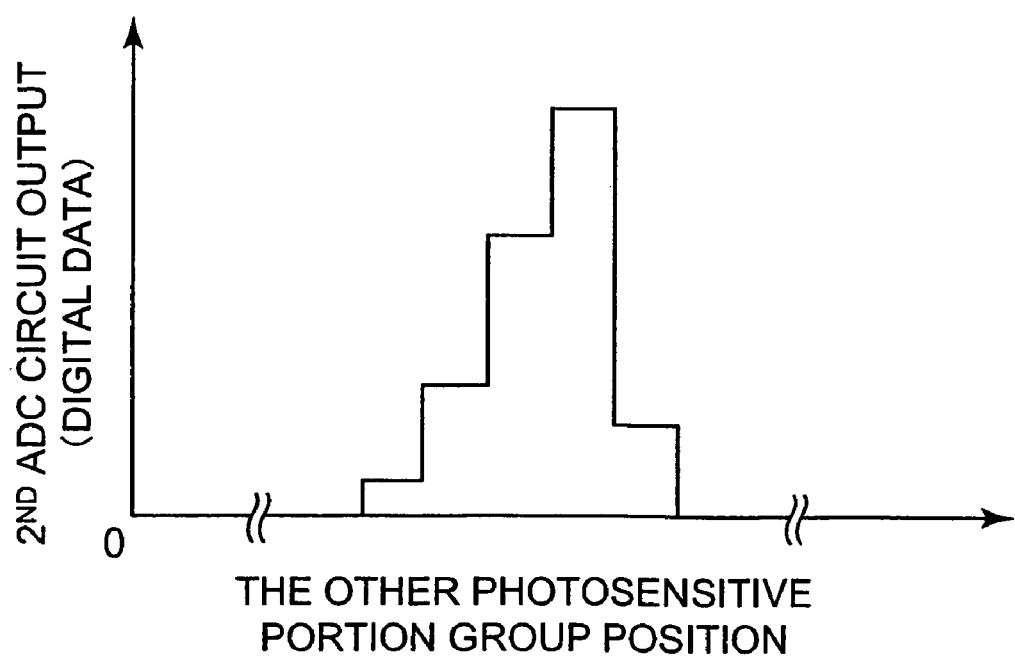
FIG. 20 is a diagram illustrating the output of a second A/D converter circuit with respect to the position of the other photosensitive portion group.

The second A/D converter circuit 280 sequentially inputs the voltages $V_{ADIN2}$ (analog values) outputted from the second level shift circuit 270, converts the voltages $V_{ADIN2}$ into digital values, and outputs the digital values. As shown in FIG. 20, these digital values become an output indicative of a luminous profile (digital data) in the first direction. The A/D conversion range of the second A/D converter circuit 280 becomes a voltage range from 0 to the shift voltage $V_{shift2}$.

As in the foregoing, with respect to light incident on one pixel $11_{mn}$ in the photodetector 1 in accordance with this embodiment, respective currents corresponding to the intensities of light incident on a plurality of photosensitive portions $12_{mn}$, $13_{mn}$ constituting the pixel are outputted for the photosensitive portions $12_{mn}$, $13_{mn}$. Since one set of photosensitive portions $12_{mn}$ are electrically connected to each other in a plurality of pixels $11_{11}$ to $11_{1N}$, $11_{21}$ to $11_{2N}$, ..., $11_{M1}$ to $11_{MN}$ arranged in the first direction in the two-dimensional arrangement, the electric currents outputted from one set of photosensitive portions $12_{mn}$ are transmitted to the first direction. Since the other set of photosensitive portions $13_{mn}$ are electrically connected to each other in a plurality of pixels $11_{11}$ to $11_{M1}$, $11_{12}$ to $11_{M2}$, ..., $11_{M1}$ to $11_{MN}$ arranged in the second direction in the two-dimensional arrangement, the electric currents outputted from the other set of photosensitive portions $13_{mn}$ are transmitted to the second direction. Thus, the electric currents from one set of photosensitive portions $12_{mn}$ are transmitted to the first direction whereas the electric currents from the other set of photosensitive portions $13_{mn}$ are transmitted to the second direction, whereby the respective luminous profiles in the first and second directions can be obtained independently from each other. As a result, a quite simple configuration of arranging a plurality of photosensitive portions $12_{mn}$, $13_{mn}$ in one pixel can rapidly detect a two-dimensional position of incident light.

In the photodetector 1 in accordance with this embodiment, each of the photosensitive portions $12_{mn}$, $13_{mn}$ includes a semiconductor substrate 40 and second conduction type semiconductor regions 41, 42. The second conduction type semiconductor regions 41, 42 may each have a substantially triangular form as seen in the light-incident direction, while being arranged such that their respective one sides are adjacent to each other in one pixel. In this case, when arranging a plurality of photosensitive portions $12_{mn}$, $13_{mn}$ within one pixel, the areas of the photosensitive portions $12_{mn}$, $13_{mn}$ (second conduction type semiconductor regions 41, 42) can be restrained from decreasing.

In the photodetector 1 in accordance with this embodiment, the second conduction type semiconductor regions 41, 42 may each have a substantially rectangular form as seen in the light-incident direction, while being arranged such that their respective longer sides are adjacent to each other in one pixel. In this case, when arranging a plurality of photosensitive portions $12_{mn}$, $13_{mn}$ within one pixel, the areas of the photosensitive portions $12_{mn}$, $13_{mn}$ (second conduction type semiconductor regions 41, 42) can be restrained from decreasing.

In the photodetector 1 in accordance with this embodiment, the second conduction type semiconductor regions 41, 42 may each have a polygonal form of quadrangular or higher as seen in the light-incident direction, while being arranged such that their respective one sides are adjacent to each other in one pixel. In this case, when arranging a plurality of photosensitive portions $12_{mn}$, $13_{mn}$ within one pixel, the areas of the photosensitive portions $12_{mn}$, $13_{mn}$ (second conduction type semiconductor regions 41, 42) can be restrained from decreasing. This reduces the perimeter of each photosensitive portion $12_{mn}$, $13_{mn}$ with respect to its area as well, thereby lowering the dark current per unit area. As a polygonal form of quadrangular or higher, a rhombus form may be employed.

In the photodetector 1 in accordance with this embodiment, the second conduction type semiconductor regions 41, 42 may be arranged in a row in a third direction intersecting with the first and second directions in one pixel. In this case, in one photosensitive portion $12_{mn}$ group and the other photosensitive portion $13_{mn}$ group, the photosensitive portions $12_{mn}$, $13_{mn}$ corresponding to the respective center parts of the photosensitive portion groups $12_{mn}$, $13_{mn}$ are concentrated, whereby the resolution can be improved.

The second conduction type semiconductor regions 41, 42 may be arranged like a honeycomb as seen in the light-incident direction. In this case, when arranging a plurality of photosensitive portions $12_{mn}$, $13_{mn}$ (second conduction type semiconductor regions 41, 42) within one pixel, the areas of the photosensitive portions $12_{mn}$, $13_{mn}$ can further be restrained from decreasing. Also, their high geometric symmetry can suppress the unevenness occurring when a mask used for forming the second conduction type semiconductor regions 41, 42 (photosensitive portions $12_{mn}$, $13_{mn}$) is displaced.

In the photodetector 1 in accordance with this embodiment, the first wire 44 extends in the first direction between the pixels $11_{mn}$, whereas the second wire 47 extends in the second direction between the pixels $11_{mn}$. As a consequence, the wires 44, 47 do not hinder light from becoming incident on the photosensitive portions $12_{mn}$, $13_{mn}$ (second conduction type semiconductor regions 41, 42), whereby the detection sensitivity can be restrained from decreasing.

In the photodetector 1 in accordance with this embodiment, while the range from the maximum value (maximum voltage $V_{max1}$) detected by the first maximum value detecting circuit 140 to a value smaller than the maximum value by a predetermined value (shift voltage $V_{shift1}$) is employed as an A/D conversion range, respective voltages outputted from the first S/H circuits 130 (first integrating circuits 110) are converted into digital values within the above-mentioned A/D conversion range, whereby the voltages smaller than the maximum value by the predetermined value (shift voltage $V_{shift1}$) are converted into "0". As a consequence, even when background light is incident on the photosensitive region 10, electric currents from one set of photosensitive portions $12_{mn}$ can be A/D-converted while in a state eliminating the background light component. On the other hand, while the range from the maximum value (maximum voltage $V_{max2}$) detected by the second maximum value detecting circuit 240 to a value smaller than the maximum value by a predetermined value (shift voltage $V_{shift2}$) is employed as an A/D conversion range, respective voltages outputted from the second S/H circuits 240 (second integrating circuits 210) are converted into digital values within the above-mentioned A/D conversion range, whereby the voltages smaller than the maximum value by the predetermined value (shift voltage $V_{shift2}$) are converted into "0". As a consequence, electric currents from the other set of photosensitive portions $13_{mn}$ can be A/D-converted while in a state eliminating the background component. As a result of the foregoing, the two-dimensional position of incident light can be detected with a very high accuracy by a small amount of calculations.

The photodetector 1 in accordance with this embodiment includes the first level shift circuit 170 for outputting to the first A/D conversion circuit 180 the voltages $V_{ADIN1}$ obtained when the voltage $(V_{max1}-V_{shift1})$ determined by subtracting a predetermined shift value (shift voltage $V_{shift1}$) from the maximum value (maximum voltage $V_{max1}$) detected by the first maximum value detecting circuit 140 is subtracted from respective voltages $H_{out}$ sequentially outputted from the first S/H circuits 130 (first integrating circuits 110), and the second level shift circuit 270 for outputting to the second A/D conversion circuit 280 the voltages $V_{ADIN2}$ obtained when the voltage $(V_{max2}-V_{shift2})$ determined by subtracting a predetermined shift value (shift voltage $V_{shift2}$) from the maximum value (maximum voltage $V_{max2}$) detected by the second maximum value detecting circuit 240 is subtracted from respective voltages $V_{out}$ sequentially outputted from the second S/H circuits 230 (second integrating circuits 210). This can set the above-mentioned A/D conversion ranges easily and reliably.

Since the first integrating circuits 110 and second integrating circuits 210 are provided so as to correspond to the respective groups of photosensitive portions $12_{mn}$, $13_{mn}$, electric charges can be accumulated from the respective groups of photosensitive portions $12_{mn}$, $13_{mn}$ at the same timing, and these electric charges can be converted into voltages.

As a result of the foregoing, respective luminous profiles in the first and second directions can be obtained with a high accuracy at a high speed. Operations of the above-mentioned first and second integrating circuits 110, 210, first and second timing control circuits 120, 220, first and second S/H circuits 130, 230, first and second maximum value detecting circuits 140, 240, first and second shift registers 150, 250, first and second switches 160, 260, first and second A/D converter circuits 180, 280, and the like are disclosed in commonly-assigned Japanese Patent Application Laid Open No. 2001-36128 and the like.

For example, when spot light having a diameter of 50 μm is incident on the photosensitive region 10 in which pixels $11_{mn}$ are arranged by 256 channels each in the first and second directions with a pitch of 7.8 μm, the photosensitive portion group on which the spot light is incident is constituted by about 7 channels, whereas the photosensitive portion group on which the spot light is not incident comprises about 249 channels. There is a fear of light from fluorescent lamps, the sun, etc. becoming incident as background light on the pixels where the spot light is not incident, thereby adversely affecting the accuracy in detecting the incident position, though its intensity is lower than that of the spot light. However, the photodetector 1 can eliminate the background light component as mentioned above, and thus can enhance the accuracy in detecting the incident position of spot light.

The photodetector 1 is effective when calculating the position of center of gravity of spot light in particular. This is because only data in the vicinity of the maximum value of respective outputs from the pixels (respective voltages outputted from the first and second S/H circuits 130, 230 (first and second integrating circuits 110, 210)) are required for calculating the position of center of gravity of the spot light.

Figure 21:
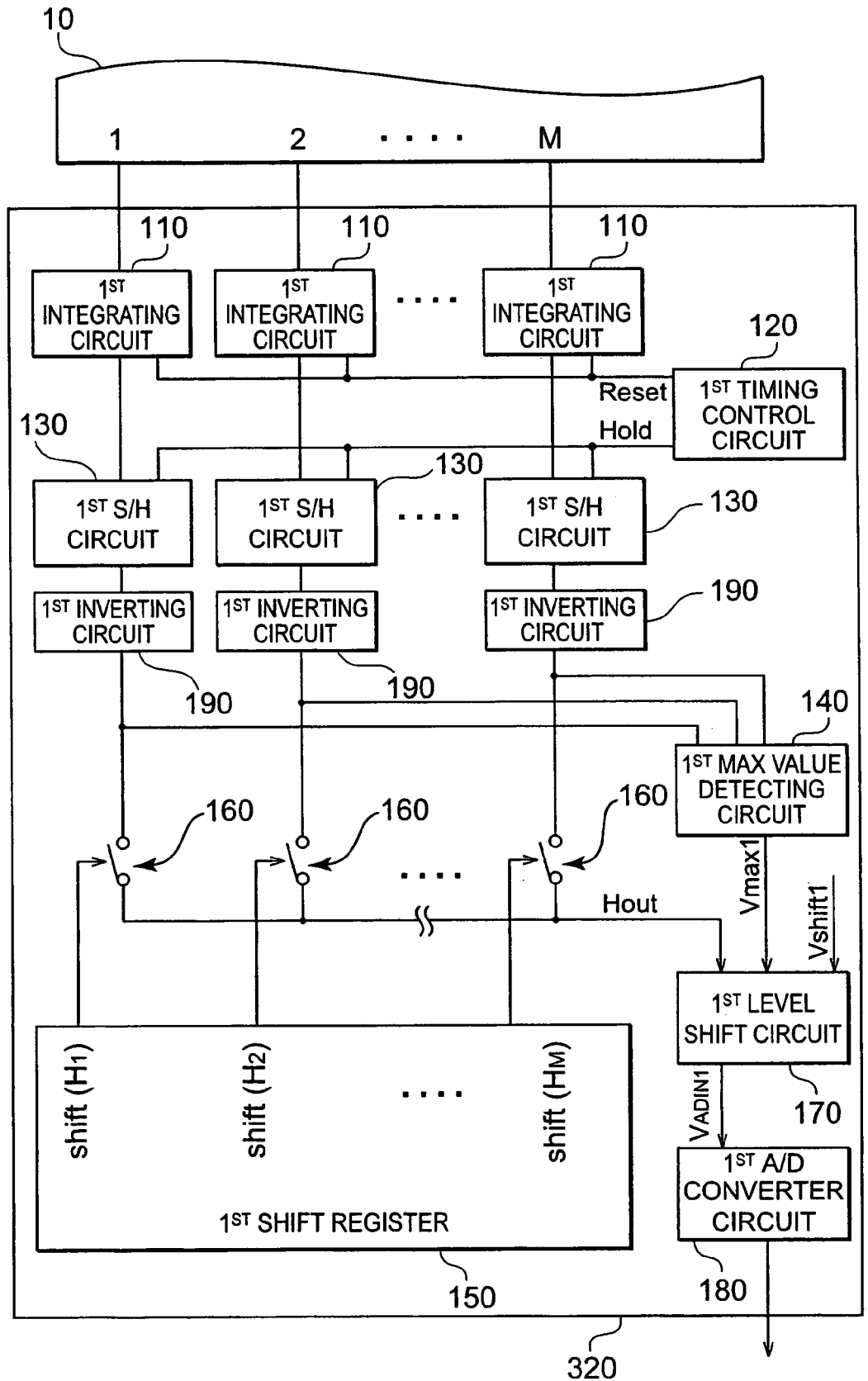
FIG. 21 is a schematic diagram illustrating a modified example of the first signal processing circuit included in the photodetector in accordance with the embodiment.
Figure 22:
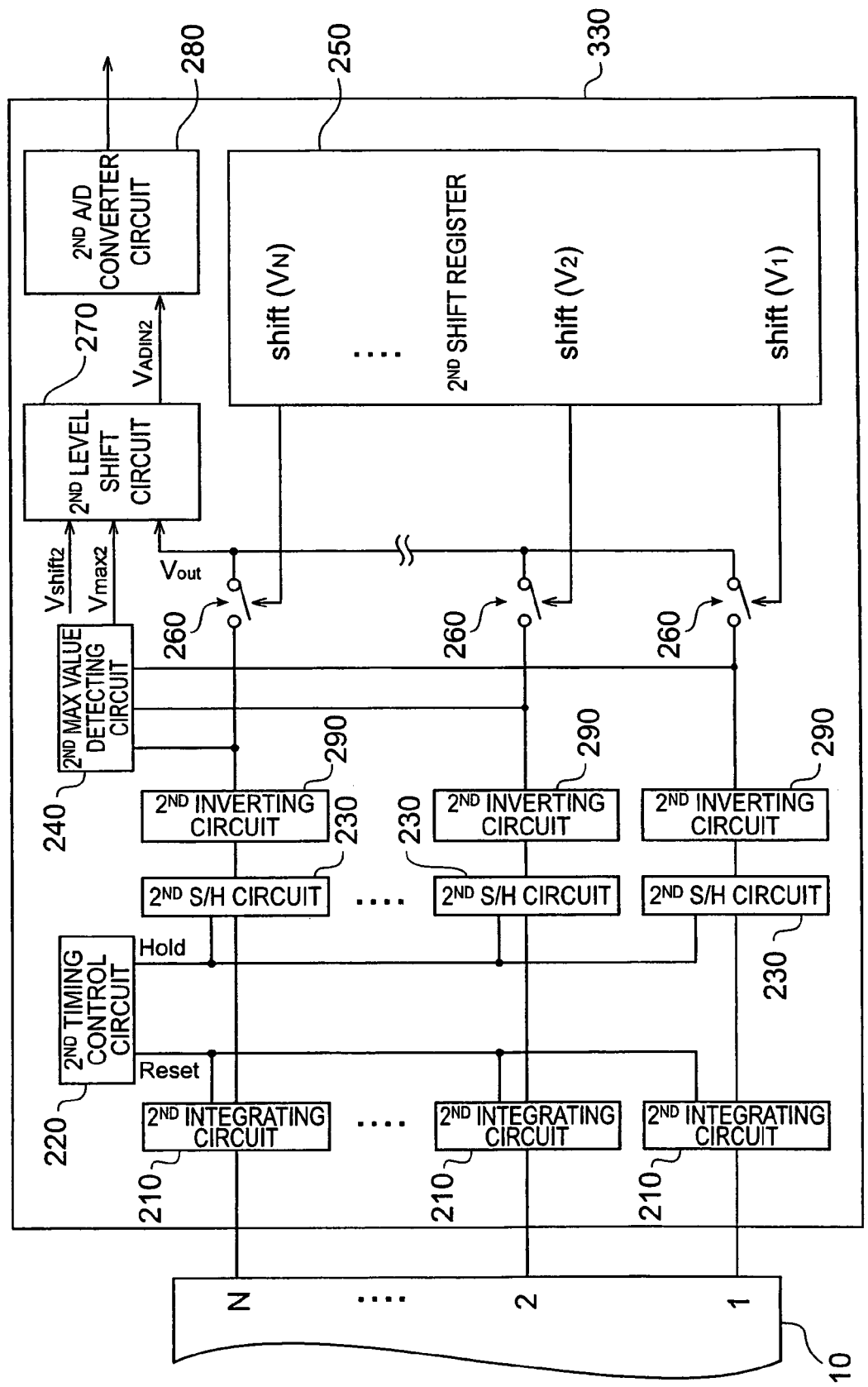
FIG. 22 is a schematic diagram illustrating a modified example of the second signal processing circuit included in the photodetector in accordance with the embodiment.

With reference to FIGS. 21 and 22, configurations of modified examples of the first and second signal processing circuits will now be explained. FIG. 21 is a schematic diagram illustrating a modified example of the first signal processing circuit, whereas FIG. 22 is a schematic diagram illustrating a modified example of the second signal processing circuit. The first signal processing circuit 320 shown in FIG. 21 differs from the above-mentioned first signal processing circuit 20 in that it includes first inverting circuits. The second signal processing circuit 330 shown in FIG. 22 differs from the above-mentioned second signal processing circuit 30 in that it includes second inverting circuits.

As shown in FIG. 21, the first signal processing circuit 320 comprises first integrating circuits 110, a first timing control circuit 120, first S/H circuits 130, a first maximum value detecting circuit 140, a first shift register 150, first switches 160, a first level shift circuit 170, a first A/D converter circuit 180, and first inverting circuits 190.

The first inverting circuits 190, which are disposed downstream their corresponding first S/H circuits 130, invert the respective voltages outputted from the first S/H circuits 130, and output the inverted voltages, which are fed into the first maximum value detecting circuit 140 and the first switches 160. As a consequence, the first maximum value detecting circuit 140 functions as a minimum value detecting circuit for detecting the minimum value of respective voltages outputted from the first S/H circuits 130. In the first A/D converter circuit 180, the range from the maximum value ($V_{max1}$) detected by the first maximum value detecting circuit 140 to a value smaller than the maximum value ($V_{max1}$) by a predetermined value ($V_{shift1}$), i.e., the range from the minimum value of respective voltages outputted from the first S/H circuits 130 (first integrating circuits 110) to a value greater than the minimum value by a predetermined value ($V_{shift1}$), is set as an A/D conversion range.

As shown in FIG. 22, the second signal processing circuit 330 comprises second integrating circuits 210, a second timing control circuit 220, second S/H circuits 230, a second maximum value detecting circuit 240, a second shift register 250, second switches 260, a second level shift circuit 270, a second A/D converter circuit 280, and second inverting circuits 290.

The second inverting circuits 290 are disposed downstream their corresponding second S/H circuits 230, invert the respective voltages outputted from the second S/H circuits 230, and output the inverted voltages, which are fed into the second maximum value detecting circuit 240 and the second switches 260. As a consequence, the second maximum value detecting circuit 240 functions as a minimum value detecting circuit for detecting the minimum value of respective voltages outputted from the second S/H circuits. In the second A/D converter circuit 280, the range from the maximum value ($V_{max2}$) detected by the second maximum value detecting circuit 240 to a value smaller than the maximum value ($V_{max2}$) by a predetermined value ($V_{shift2}$), i.e., the range from the minimum value of respective voltages outputted from the second S/H circuits 230 (second integrating circuits 210) to a value greater than the minimum value by a predetermined value ($V_{shift2}$), is set as an A/D conversion range.

As in the foregoing, while the range from the maximum value ($V_{max1}$) detected by the first maximum value detecting circuit 140 to a value smaller than the maximum value by a predetermined value ($V_{shift1}$), i.e., the range from the minimum value of respective voltages outputted from the first S/H circuits 130 (first integrating circuits 110) to a value greater than the minimum value by a predetermined value ($V_{shift1}$), is employed as an A/D conversion range, respective voltages outputted from the first S/H circuits 130 (first integrating circuits 110) are converted into digital values within the above-mentioned A/D conversion range, whereby the voltages greater than the minimum value by the predetermined value ($V_{shift1}$) are converted into "0" in this modified example. As a consequence, even when background light brighter than a point to be noted is incident on the photosensitive region 10, electric currents from one set of photosensitive portions $12_{mn}$ can be A/D-converted while in a state eliminating the background light component brighter than the point to be noted. On the other hand, while the range from the maximum value ($V_{max2}$) detected by the second maximum value detecting circuit 240 to a value smaller than the maximum value by a predetermined value ($V_{shift2}$), i.e., the range from the minimum value of respective voltages outputted from the second S/H circuits 230 (second integrating circuits 210) to a value greater than the minimum value by a predetermined value ($V_{shift2}$), is employed as an A/D conversion range, respective voltages outputted from the second S/H circuits 230 (second integrating circuits 210) are converted into digital values within the above-mentioned A/D conversion range, whereby the voltages greater than the minimum value by the predetermined value ($V_{shift2}$) are converted into "0". As a consequence, electric currents from the other set of photosensitive portions $13_{mn}$ can be A/D-converted while in a state eliminating the background light component brighter than the point to be noted. As a result of the foregoing, the two-dimensional position of incident light can accurately be detected.

The photodetector in accordance with the above-mentioned modified example can be used for detecting the position of a part having a different reflectance, e.g., the position of a black point attached to a white object.

Figure 23:
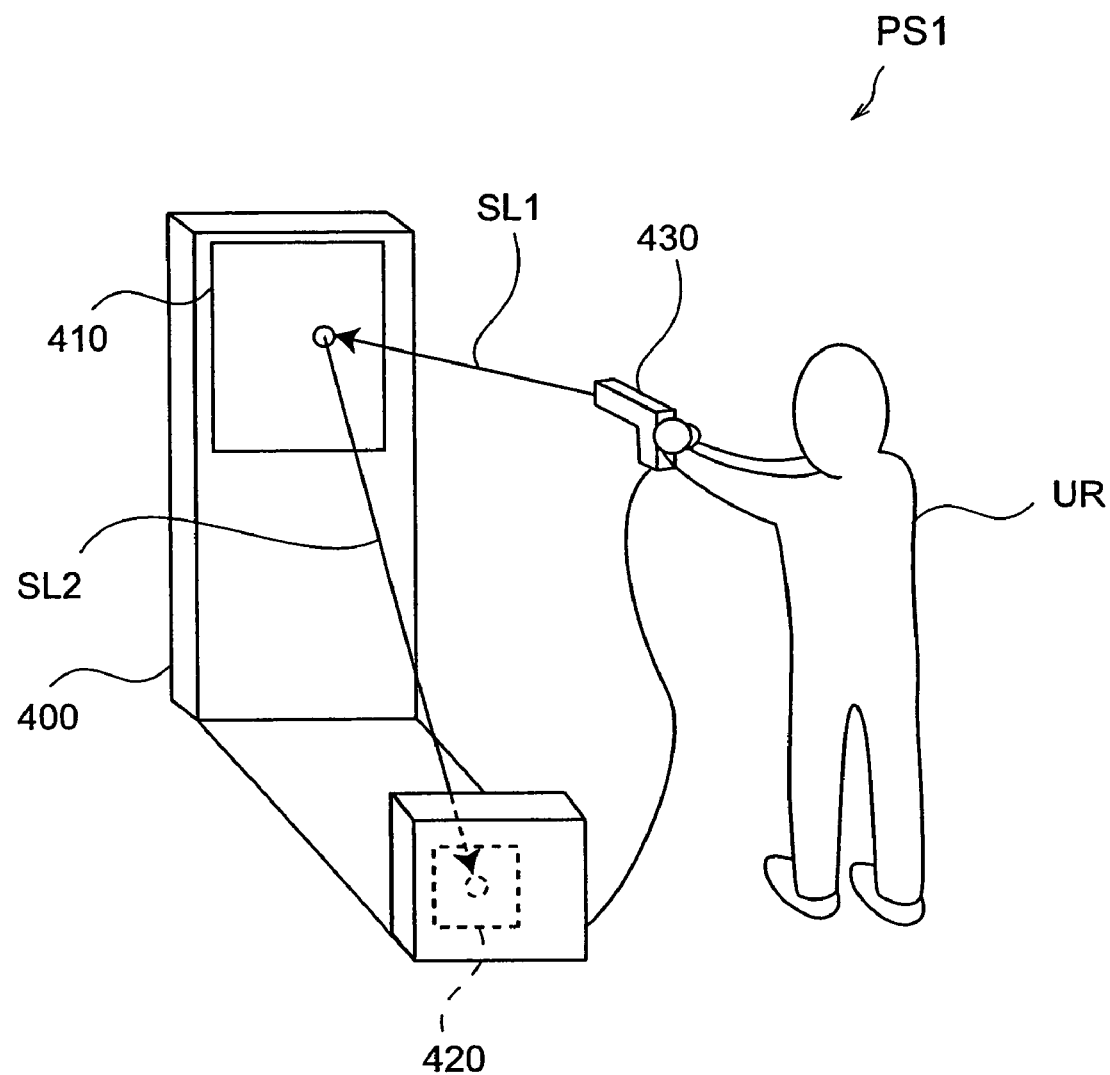
FIG. 23 is a schematic diagram illustrating an example of position detecting system using the photodetector in accordance with the embodiment.

With reference to FIG. 23, an example in which the photodetector 1 in accordance with the above-mentioned embodiment is used in a position detecting system for reflected light will now be explained.

FIG. 23 shows a position detecting system PS1. The position detecting system PS1 comprises a game housing 400 including a display 410 and a light-detecting section 420, and a controller type light-emitting device 430 simulating a gun. The display 410 outputs animation images and the like which are contents of games. For example, the position detecting system PS1 constitutes a game machine with which, by using the controller type light-emitting device 430 as an operation input device simulating a gun, a user UR performs shooting aimed at an image displayed on the display 410.

The controller type light-emitting device 430, which comprises an LED or the like as a light-emitting element, emits spot light SL1 to the display 410 (displayed image) of the game housing 400 when opposed to the display 410 by the user UR. The spot light SL1 having irradiated the display 410 after being emitted from the controller type light-emitting device 430 is reflected by the display 410, so that thus reflected light SL2 is made incident on the light-detecting section 420. The light-detecting part 420 detects the incident position (two-dimensional position) of the reflected light SL2 of spot light. As a consequence, the direction to which the controller type light-emitting device 430 is oriented can be obtained.

Figure 24:
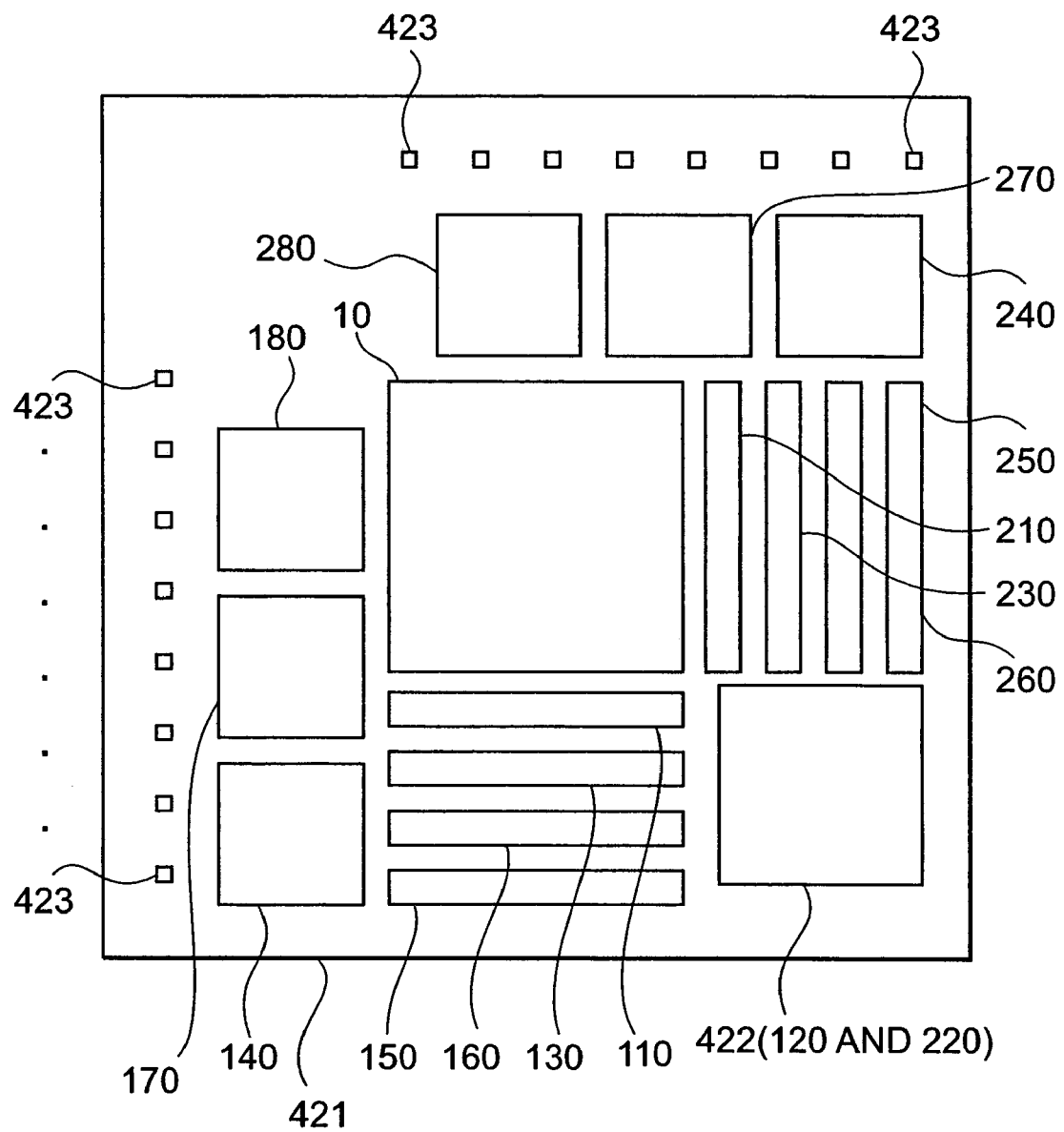
FIG. 24 is a schematic diagram illustrating a light-detecting part included in the position detecting system shown in FIG. 23.

The light-detecting section 420 uses the above-mentioned photodetector 1, and is configured as shown in FIG. 24. The light-detecting section 420 includes an IC chip 421, whereas the IC chip 421 is formed with a photosensitive region 10, a first integrating circuit 110, a first S/H circuit 130, a first shift register 140, a first shift register 150, a first switch 160, a first level shift circuit 170, a first A/D converter circuit 180, a second integrating circuit 210, a second S/H circuit 230, a second maximum value detecting circuit 240, a second shift register 250, a second switch 260, a second level shift circuit 270, a second A/D converter circuit 280, and a timing control circuit 422. The timing control circuit 422 includes a first timing control circuit 120 and a second timing control circuit 220. The IC chip 421 is also formed with electrode pads 423 for inputting/outputting signals and the like to/from the IC chip 421. The light-detecting section 420 calculates and outputs respective luminous profiles in the first and second directions in the photosensitive region 10 of reflected light SL2 of the spot light emitted from the controller type light-emitting device 430.

Figure 25:
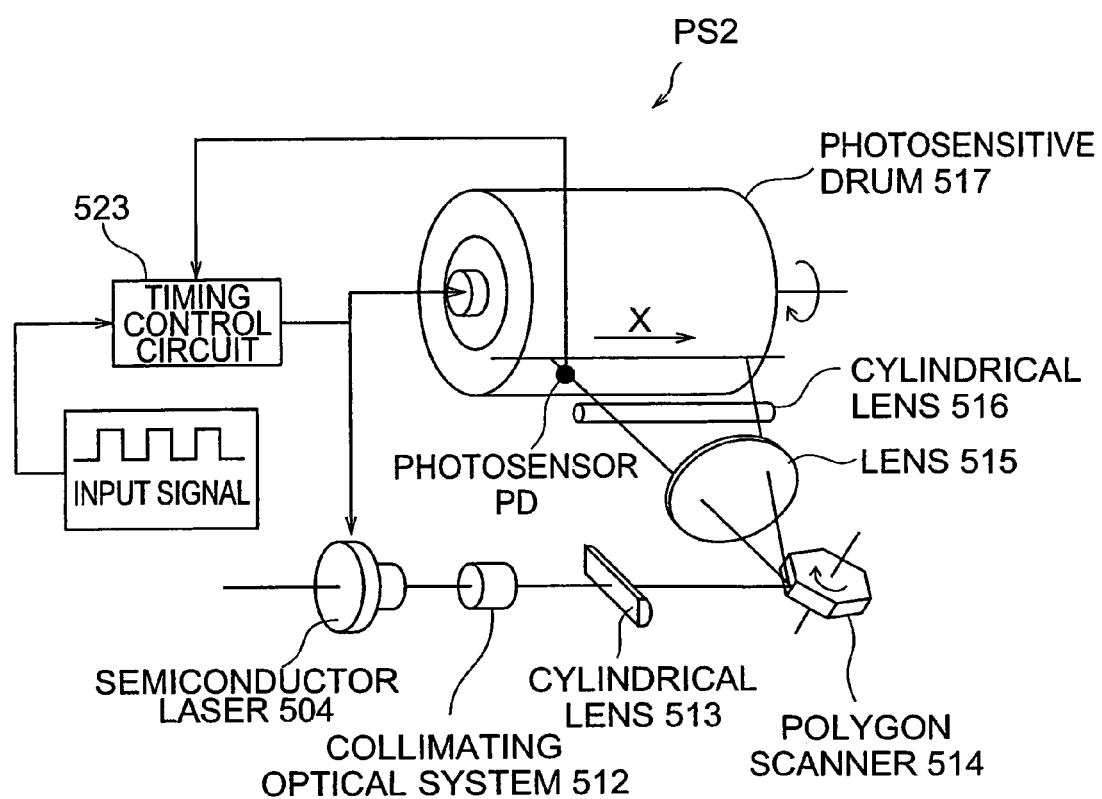
FIG. 25 is a schematic diagram illustrating a modified example of position detecting system using the photodetector in accordance with the embodiment.

With reference to FIG. 25, an example in which the photodetector 1 in accordance with the above-mentioned embodiment is used in a position detecting system for direct light will now be explained.

FIG. 25 shows a position detecting system PS2. The position detecting system PS2 is built in a laser printer. A laser beam outputted from a semiconductor laser 504 so as to diverge with a predetermined directivity is converted into a parallel laser beam by a collimating optical system 512, and is converged onto a rotary polygon mirror (polygon scanner) 514 by way of a cylindrical lens 513. The laser beam reflected by the rotary polygon mirror (deflector) 514 so as to be deflected is corrected by a lens 515 in terms of moving speed, and then is converged onto a photosensitive drum 517 by way of a cylindrical lens 516. A photosensor PD is disposed on a main scanning line (central reference line) of the laser beam, and monitors the laser beam. The photosensor PD is the above-mentioned photodetector 1, and calculates and outputs respective luminous profiles in the first and second directions in the photosensitive region 10 of direct light of the laser beam emitted from the semiconductor laser 504.

The output of the photosensor PD is fed into a timing control circuit 523. The timing control circuit 523, in which image signals have been inputted as input signals, controls the emission of the semiconductor laser 504 in relation to the image signals. The timing control circuit 523 also controls the rotating speed of the photosensitive drum 517.

The photodetector 1 in accordance with this embodiment can be used not only in the above-mentioned position detecting systems for reflected or direct light, but also in position detecting systems for parts having a different reflectance. For example, the photodetector 1 can be used in pattern detectors (photodetecting sensors) in color registration detecting apparatus disclosed in Japanese Patent Application Laid-Open No. 2001-134034 and 2002-221840.

The present invention is not limited to the aforementioned embodiment. For example, instead of using a shift register, it is possible to connect each of the photosensitive portions 12$mn$ and 13$mn$ (second conductive type semiconductor regions 41 and 42) by uniform resistance wires. Thereafter, electric charges generated owing to incident light are obtained from an end of the resistance wire after resistive division of the electric charges is carried out so that the electric charges are inversely proportional to a distance between the end of each resistance wire and the position in the resistance wire into which the electric charges have been flown. Subsequently, a light-incident position is obtained based on an electric current output from the end of each resistance wire.

Figure 26:
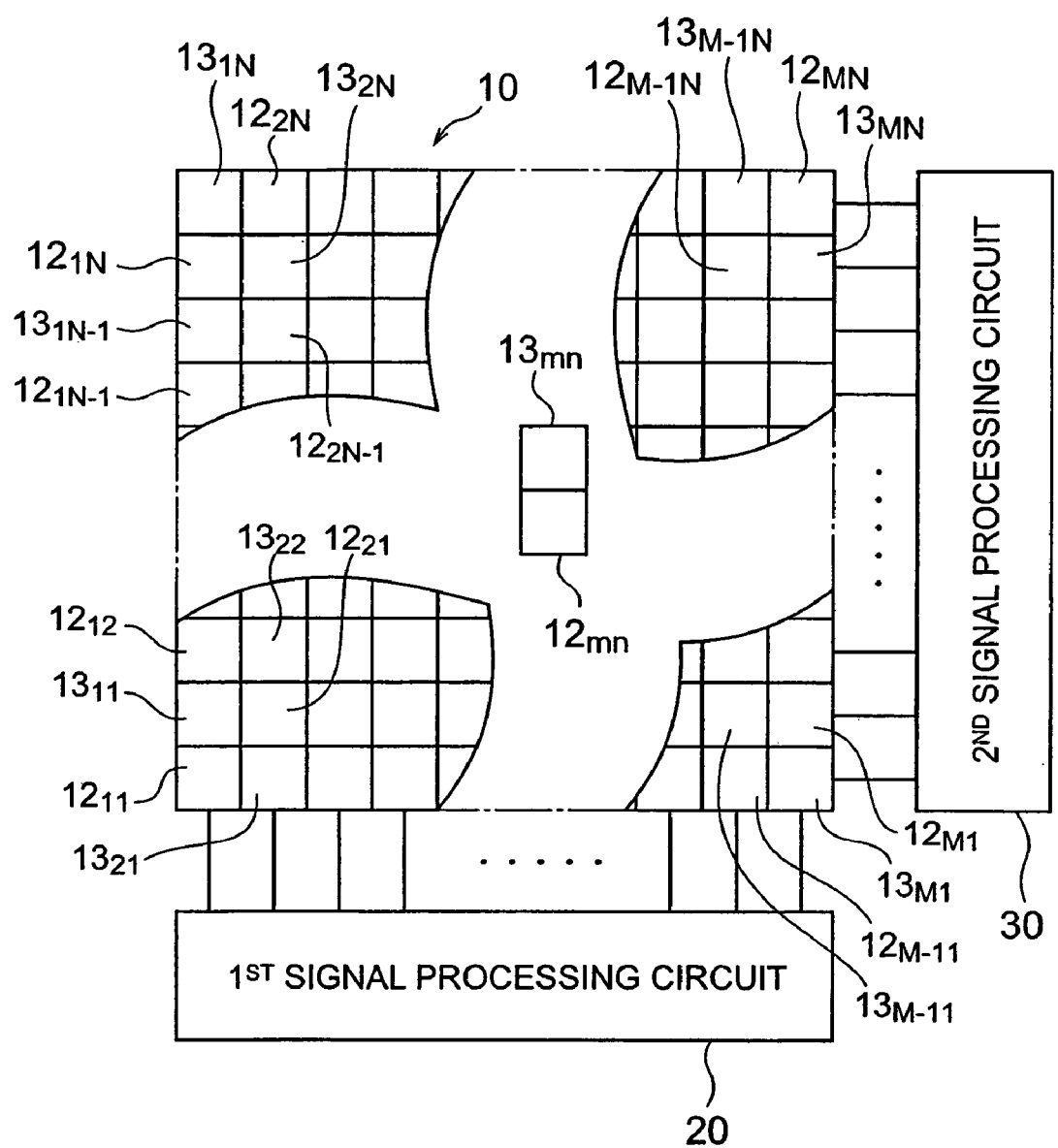
FIG. 26 is a conceptual diagram illustrating a modified example of the photodetector in accordance with the embodiment.

Though one pixel is constituted by a plurality of photosensitive portions in the above-mentioned embodiment, one pixel may be constituted by one photosensitive portion as well. For example, as shown in FIG. 26, the photosensitive region 10 may include a plurality of first photosensitive portions 12$_{mn}$ electrically connected to each other in the first direction and a plurality of second photosensitive portions 13$_{mn}$ electrically connected to each other in the second direction, whereas a plurality of first photosensitive portions 12$_{mn}$ and a plurality of second photosensitive portions 13$_{mn}$ may be arranged within the same plane while in a state two-dimensionally mingling with each other. In this case, the first photosensitive portions 12$_{mn}$ and second photosensitive portions 13$_{mn}$ are arranged in a checkerboard pattern, so as to alternate with each other in the first and second directions. They may be arranged like a honeycomb as shown in FIG. 8 instead of the checkerboard pattern.

The respective shift voltages $V_{shift1}$, $V_{shift2}$ fed into the first and second level shift circuits 120, 270 may be either the same value or values different from each other.

INDUSTRIAL APPLICABILITY

The photodetector of the present invention can be utilized in incident position detecting systems for reflected light or direct light.

The invention claimed is:

1. A photodetector including a photosensitive region where pixels are arranged two-dimensionally;
   each pixel being constructed by arranging a plurality of photosensitive portions outputting respective electric currents corresponding to incident light intensities adjacent to each other within a single plane;
   photosensitive portions on one side out of the plurality of photosensitive portions constituting each of said pixels are electrically connected to each other across the plurality of pixels arrayed in a first direction in the two-dimensional array,
   photosensitive portions on another side out of the plurality of photosensitive portions constituting each of said pixels are electrically connected to each other across the plurality of pixels arrayed in a second direction in the two-dimensional array,
   the photodetector comprising:
   first integrating circuits which are provided correspond to groups of the photosensitive portions on one side which are electrically connected across the plurality of pixels arrayed in the first direction, convert corresponding electric currents from the groups of photosensitive portions on one side into voltages, and output the voltages;
   a first maximum value detecting circuit which detects a maximum value of the respective voltages outputted from the first integrating circuits;
   a first A/D converter circuit which converts the respective voltages outputted from the first integrating circuits into digital values within an A/D conversion range from the maximum value detected by the first maximum value detecting circuit to a value smaller than the maximum value by a predetermined value and outputting the digital values;
   a first level shift circuit which determines a voltage by subtracting a predetermined value from the maximum value detected by the first maximum value detecting circuit, subtracting thus determined voltage from the respective voltages outputted from the first integrating circuits, and outputs the resulting outputs to the first A/D converter circuit;

second integrating circuits which are provided correspond to groups of the photosensitive portions on another side which are electrically connected across the plurality of pixels arrayed in the second direction, convert corresponding electric currents from the groups of photosensitive portions on another side into voltages, and output the voltages;

a second maximum value detecting circuit for detecting a maximum value of the respective voltages outputted from the second integrating circuits;

a second A/D converter circuit for converting the respective voltages outputted from the second integrating circuits into digital values within an A/D conversion range from the maximum value detected by the second maximum value detecting circuit to a value smaller than the maximum value by a predetermined value and outputting the digital values; and a second level shift circuit which determines a voltage by subtracting a predetermined value from the maximum value detected by the second maximum value detecting circuit, subtracting thus determined voltage from the respective voltages outputted from the second integrating circuits, and outputs the resulting outputs to the second A/D converter circuit.

2. A photodetector including a photosensitive region where pixels are arranged two-dimensionally;

each pixel being constructed by arranging a plurality of photosensitive portions outputting respective electric currents corresponding to incident light intensities adjacent to each other within a single plane;

photosensitive portions on one side out of the plurality of photosensitive portions constituting each of said pixels are electrically connected to each other across the plurality of pixels arrayed in a first direction in the two-dimensional array;

photosensitive portions on another side out of the plurality of photosensitive portions constituting each of said pixels are electrically connected to each other across the plurality of pixels arrayed in a second direction in the two-dimensional array;

the photodetector comprising:

first integrating circuits which are provided correspond to groups of photosensitive portions on one side which are electrically connected across the plurality of pixels arrayed in the first direction, convert corresponding electric currents from the groups of photosensitive portions on one side into voltages, and outputs the voltages;

a first minimum value detecting circuit for detecting a minimum value of the respective voltages outputted from the first integrating circuits;

a first A/D converter circuit for converting the respective voltages outputted from the first integrating circuits into digital values within an A/D conversion range from the minimum value detected by the first minimum value detecting circuit to a value greater than the minimum value by a predetermined value and outputting the digital values;

second integrating circuits which are provided correspond to groups of photosensitive portions on another side which are electrically connected across the plurality of pixels arrayed in the second direction, convert corresponding electric currents from groups of photosensitive portions on another side into voltages, and outputs the voltages;

a second minimum value detecting circuit for detecting a minimum value of the respective voltages outputted from the second integrating circuits; and a second A/D converter circuit for converting the respective voltages outputted from the second integrating circuits into digital values within an A/D conversion range from the minimum value detected by the second maximum value detecting circuit to a value greater than the minimum value by a predetermined value and outputting the digital values.

3. A photodetector according to claim 1 or 2, wherein the photodetector is used together with a light source for irradiating an object with light, and arithmetically operates information concerning the light emitted from the light source.

4. A photodetector according to claim 3, wherein the information concerning the light is a luminous profile of reflected light of the light emitted from the light source in the first and second directions in the two-dimensional arrangement.

5. A photodetector according to claim 3, wherein the information concerning the light is a luminous profile of direct light of the light emitted from the light source in the first and second directions in the two-dimensional arrangement.

* * * * *